(12) United States Patent
Pinos et al.

(10) Patent No.: US 12,495,657 B1
(45) Date of Patent: Dec. 9, 2025

(54) MICRO-LED WITH FIELD-EFFECT ISOLATION

(71) Applicant: Meta Platforms Technologies, LLC, Menlo Park, CA (US)

(72) Inventors: Andrea Pinos, Plymouth (GB); Wei Sin Tan, Plymouth (GB); Samir Mezouari, Swindon (GB); Sean Denis Connor, Swindon (GB)

(73) Assignee: Meta Platforms Technologies, LLC, Menlo Park, CA (US)

( * ) Notice: Subject to any disclaimer, the term of this patent is extended or adjusted under 35 U.S.C. 154(b) by 495 days.

(21) Appl. No.: 18/063,923

(22) Filed: Dec. 9, 2022

(51) Int. Cl.
  *H10H 29/14* (2025.01)
  *H01L 25/18* (2023.01)

(52) U.S. Cl.
  CPC ........... *H10H 29/142* (2025.01); *H01L 25/18* (2013.01)

(58) Field of Classification Search
  CPC .............................. H10H 29/142; H01L 25/18
  See application file for complete search history.

(56) References Cited

U.S. PATENT DOCUMENTS

| | | | |
|---|---|---|---|
| 11,784,287 | B2 | 10/2023 | Tonkikh et al. |
| 2001/0000410 | A1 | 4/2001 | Krames et al. |
| 2016/0315218 | A1 | 10/2016 | Bour et al. |
| 2017/0358711 | A1 | 12/2017 | Aoyagi et al. |
| 2020/0044117 | A1 | 2/2020 | Vierheilig et al. |
| 2021/0193730 | A1 | 6/2021 | Armitage et al. |
| 2022/0278255 | A1* | 9/2022 | Zhang .................. H10H 20/857 |
| 2022/0384682 | A1 | 12/2022 | Smith et al. |

FOREIGN PATENT DOCUMENTS

| | | |
|---|---|---|
| CN | 112289901 A | 1/2021 |
| JP | H09219567 A | 8/1997 |

OTHER PUBLICATIONS

Alexiev D., et al., "Minority Carrier Diffusion Lengths for High Purity Liquid Phase Epitaxial GaAs," arXiv:cond-mat/0409176, 2004, 8 pages.

International Preliminary Report on Patentability for International Application No. PCT/US2022/029355, mailed Dec. 7, 2023, 11 pages.

(Continued)

*Primary Examiner* — Elias Ullah
(74) *Attorney, Agent, or Firm* — Greenberg Traurig, LLP

(57) ABSTRACT

A micro-light emitting diode (micro-LED) device includes a plurality of semiconductor epitaxial layers that includes a quantum well layer configured to emit light. The micro-LED device also includes an array of electrodes for an array of micro-LEDs, the array of electrodes coupled to the plurality of semiconductor epitaxial layers. The micro-LED device further includes an insulator grid coupled to the plurality of semiconductor epitaxial layers and positioned in regions between individual electrodes of the array of electrodes, and a gate grid coupled to the insulator grid and configured to apply an electric field through the insulator grid to the plurality of semiconductor epitaxial layers in the regions between the individual electrodes of the array of electrodes to electrically isolate the plurality of semiconductor epitaxial layers into individual micro-LEDs of the array of micro-LEDs.

20 Claims, 20 Drawing Sheets

(56) References Cited

OTHER PUBLICATIONS

International Search Report and Written Opinion for International Application PCT/US2022/029355, mailed Sep. 1, 2022, 13 pages.
Lenka T.R., et al., "Characteristics Study of 2DEG Transport Properties of AlGaN/GaN and AlGaAs/GaAs-Based HEMT," Physics and Technology of Semiconductors, 2011, vol. 45, No. 5, pp. 660-665.
Mondal S., et al., "Field-Effect-Induced Two-Dimensional Electron Gas Utilizing Modulation Doping for Improved Ohmic Contacts," arXiv:1405.1273, 2014, 8 pages.
Non-Final Office Action mailed Dec. 21, 2022 for U.S. Appl. No. 17/331,306, filed May 26, 2021, 12 pages.
Notice of Allowance mailed May 30, 2023 for U.S. Appl. No. 17/331,306, filed May 26, 2021, 7 pages.
Ye P.D., et al., "Depletion-Mode InGaAs Metal-Oxide-Semiconductor Field-Effect Transistor with Oxide Gate Dielectric Grown by Atomic-Layer Deposition," Applied Physics Letters, Jan. 19, 2004, vol. 84, No. 3, pp. 434-436.
Aagesen L.K., et al., "Phase-Field Simulations of GaN Growth by Selective Area Epitaxy from Complex Mask Geometries," Journal of Applied Physics, May 15, 2015, vol. 117, No. 19, 14 pages.
Kamler G., et al., "Application of Orthodox Defect-Selective Etching for Studying GaN Single Crystals, Epitaxial Layers and Device Structures," The European Physical Journal-Applied Physics, Jul. 15, 2004, vol. 27, pp. 247-249.
Liu J-L., et al., "Status of GaN-Based Green Light-Emitting Diodes," Chinese Physics B, Apr. 10, 2015, vol. 24, No. 6, 8 pages.
Mei J., et al., "Basal-Plane Slip in InGaN/GaN Heterostructures in the Presence of Threading Dislocations," Applied Physics Letters, Apr. 26, 2007, vol. 90, No. 17, 3 pages.

\* cited by examiner

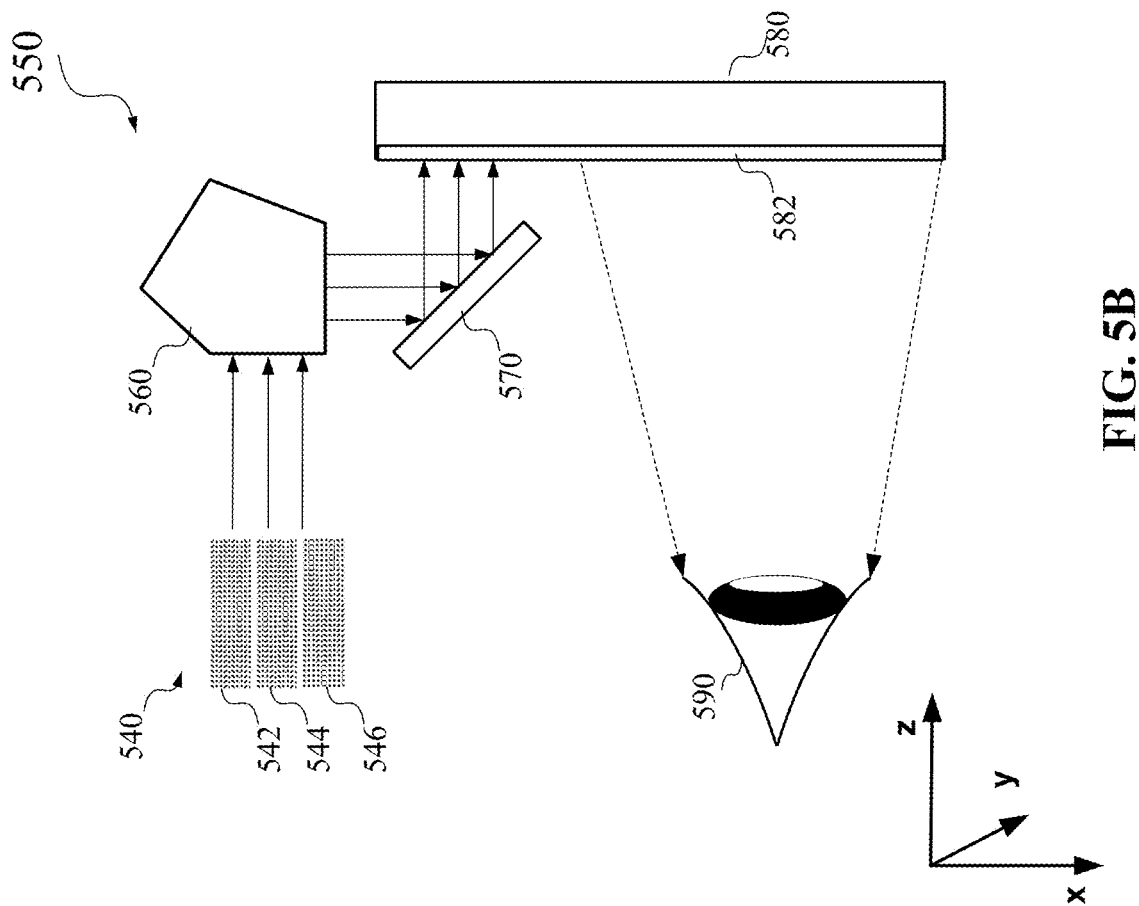
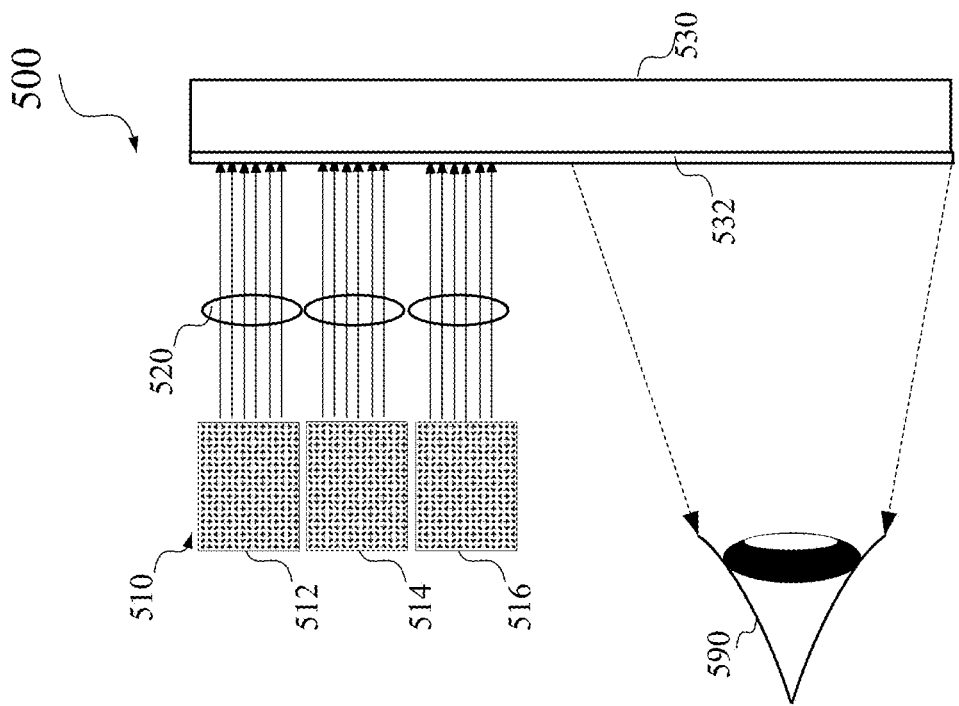
FIG. 5B
FIG. 5A

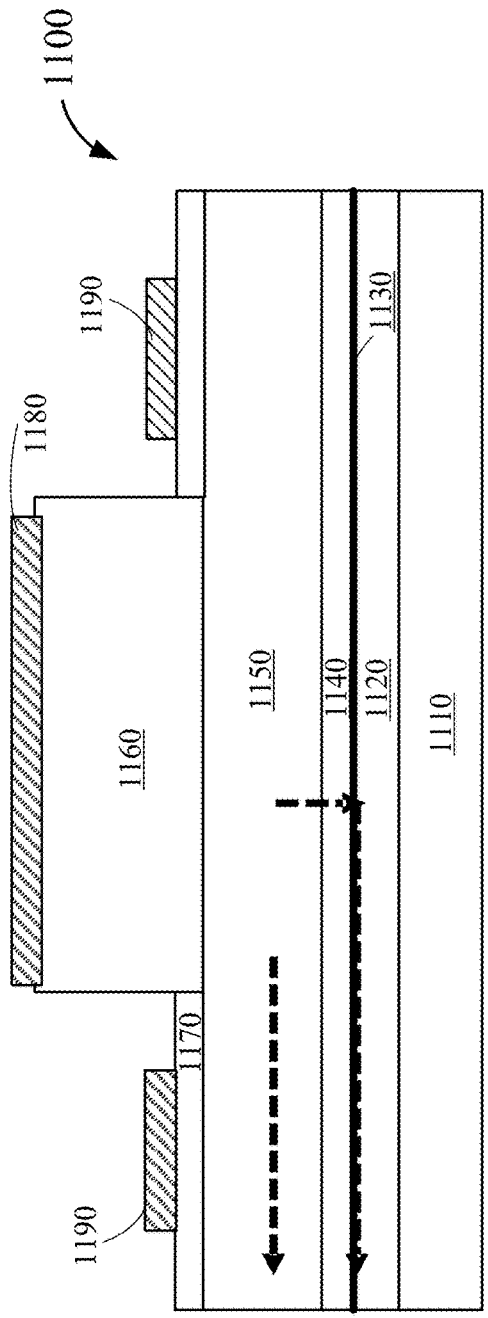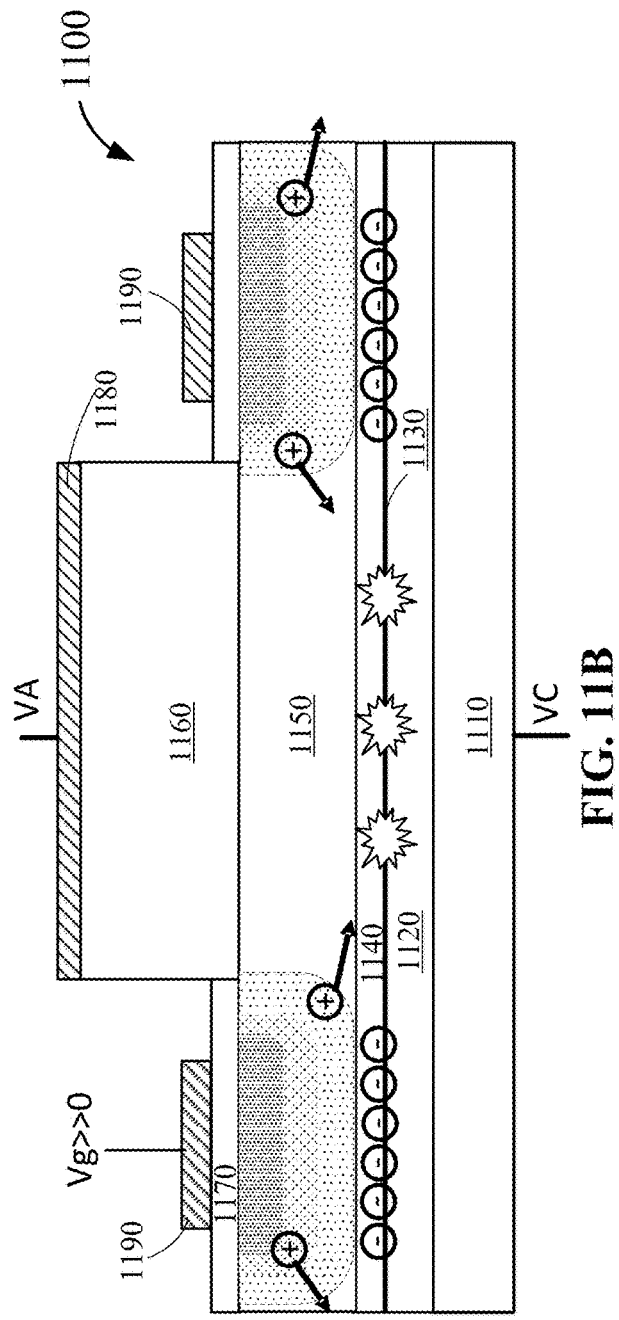
FIG. 11A
FIG. 11B

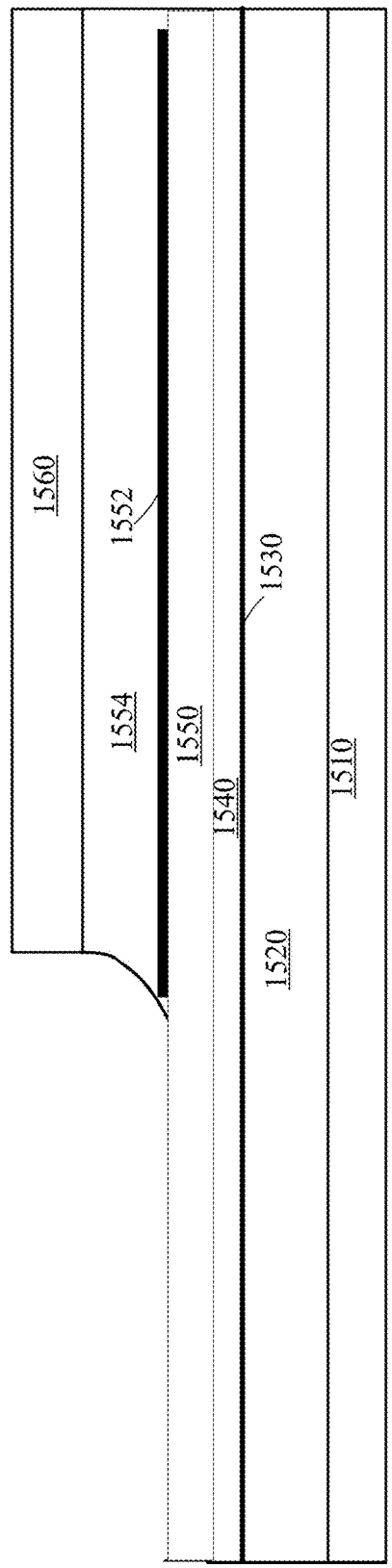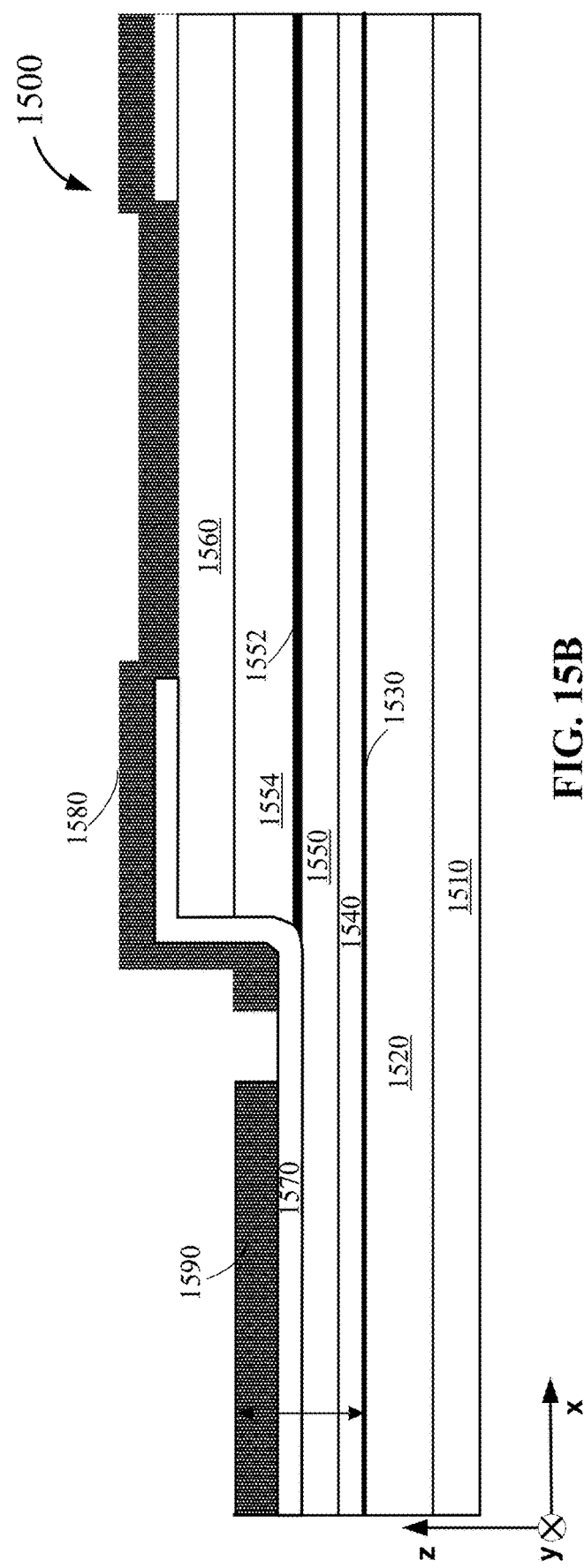

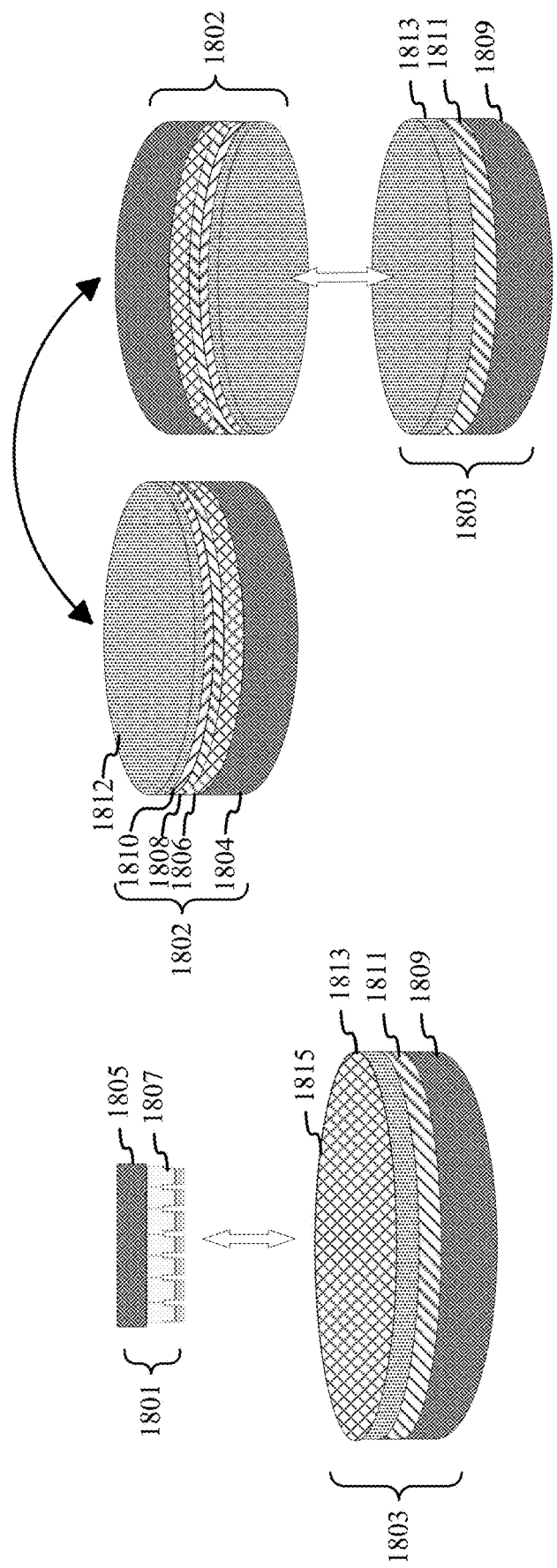

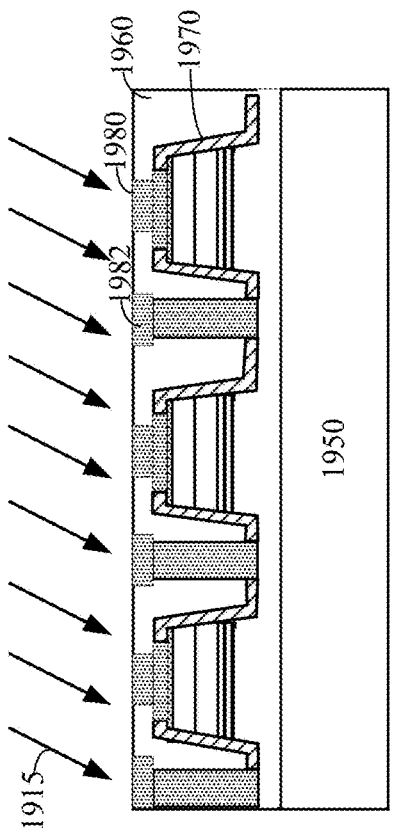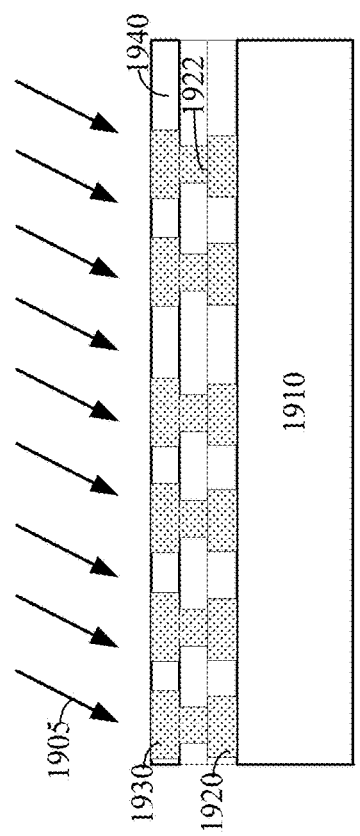
FIG. 19A
FIG. 19B
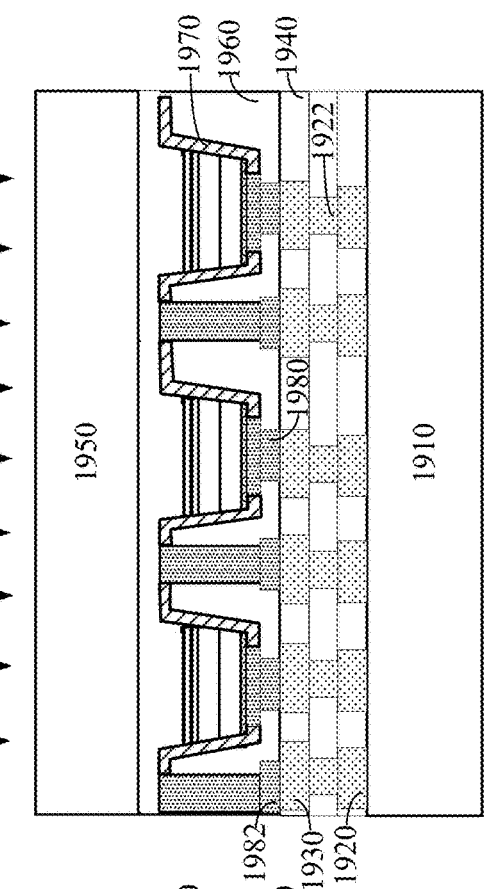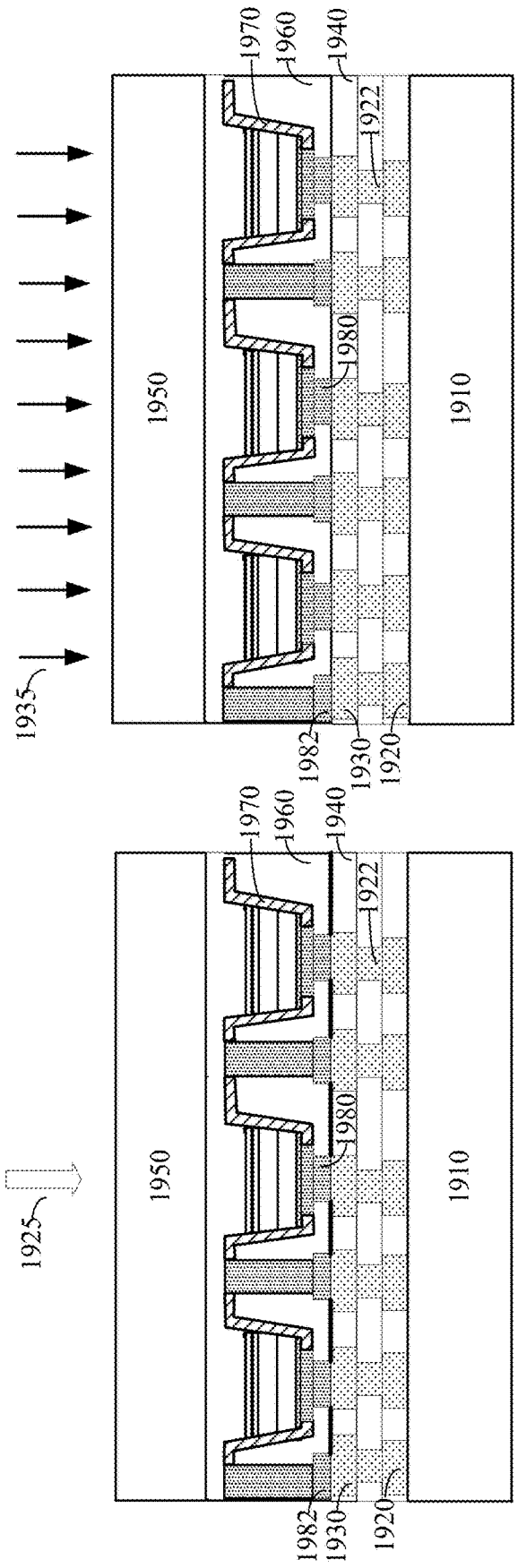
FIG. 19C
FIG. 19D

MICRO-LED WITH FIELD-EFFECT ISOLATION

BACKGROUND

Light emitting diodes (LEDs) convert electrical energy into optical energy, and offer many benefits over other light sources, such as reduced size, improved durability, and increased efficiency. LEDs can be used as light sources in many display systems, such as televisions, computer monitors, laptop computers, tablets, smartphones, projection systems, and wearable electronic devices. Micro-LEDs ("µLEDs") based on III-V semiconductors, such as alloys of GaN, InN, InGaN, AlGaInP, other ternary and quaternary arsenide and phosphide alloys, and the like, have begun to be developed for various display applications due to their small size (e.g., with a linear dimension less than 100 µm, less than 50 µm, less than 10 µm, or less than 5 µm), high packing density (and hence higher resolution), and high brightness. For example, micro-LEDs that emit light of different colors (e.g., red, green, and blue) can be used to form the subpixels of a display system, such as a television or a near-eye display system.

SUMMARY

This disclosure relates generally to micro-light emitting diodes (micro-LEDs). More specifically, this disclosure relates to micro-LED devices including field-effect isolations between individual micro-LEDs for non-radiative recombination reduction. Various inventive embodiments are described herein, including devices, systems, methods, structures, materials, processes, and the like.

According to certain embodiments, a micro-light emitting diode (micro-LED) device may include a plurality of semiconductor epitaxial layers that includes a quantum well layer configured to emit light, an array of electrodes for an array of micro-LEDs coupled to the plurality of semiconductor epitaxial layers, an insulator grid coupled to the plurality of semiconductor epitaxial layers and positioned in regions between individual electrodes of the array of electrodes, and a gate grid coupled to the insulator grid and configured to apply an electric field through the insulator grid to the plurality of semiconductor epitaxial layers in the regions between the individual electrodes of the array of electrodes to electrically isolate the plurality of semiconductor epitaxial layers into individual micro-LEDs of the array of micro-LEDs.

In some embodiments of the micro-LED device, the plurality of semiconductor epitaxial layers may include a cladding layer between the quantum well layer and the insulator grid and between the quantum well layer and the array of electrodes, and the gate grid may be configured to apply the electric field to deplete holes in the cladding layer between the quantum well layer and the insulator grid. In some embodiments, the cladding layer may be thinner in regions between the quantum well layer and the insulator grid than in regions between the quantum well layer and the array of electrodes. In some embodiments, the cladding layer between the quantum well layer and the array of electrodes may include an etch-stop layer (e.g., including AlAs) embedded in the cladding layer. In some embodiments, the plurality of semiconductor epitaxial layers may include at least two quantum barrier layers that sandwich the quantum well layer, and the cladding layer may be characterized by an energy bandgap wider than energy bandgaps of the at least two quantum barrier layers. In some embodiments, the cladding layer may include AlGaInP.

In some embodiments of the micro-LED device, the plurality of semiconductor epitaxial layers may include a cladding layer between the quantum well layer and the array of electrodes but not between the quantum well layer and the insulator grid. In some aspects, the gate grid may be configured to apply the electric field to accumulate electrons in regions of the quantum well layer that are aligned with the gate grid. In some embodiments, the array of electrodes may include an array of anodes for the array of micro-LEDs, and may include a common cathode for the array of micro-LEDs. In some embodiments, each electrode of the array of electrodes may include a transparent conductive oxide layer coupled to the plurality of semiconductor epitaxial layers, and a metal layer coupled to the transparent conductive oxide layer. In some embodiments, the gate grid may be electrically shorted to an electrode of the array of electrodes for a micro-LED of the array of micro-LEDs. The micro-LED device may also include a backplane bonded to the array of electrodes, the backplane including drive circuits for driving the array of micro-LEDs.

In some embodiments, the micro-LED device may also include an array of micro-lenses on a side of the plurality of semiconductor epitaxial layers opposing the array of electrodes. In some embodiments, each electrode of the array of electrodes may include a transparent conductive oxide layer coupled to the plurality of semiconductor epitaxial layers, a first distributed Bragg reflector (DBR) structure coupled to the transparent conductive oxide layer, a metal layer coupled to the first DBR structure, and a through-via in the first DBR structure, the through-via electrically coupling the metal layer to the transparent conductive oxide layer. In some embodiments, the micro-LED device may further include a second DBR structure, where the first DBR structure and the second DBR structure may be on opposite sides of the plurality of semiconductor epitaxial layers to form a resonant cavity. In some embodiments, the gate grid may include a transparent conductive oxide layer coupled to the insulator grid. The gate grid may further include a metal layer electrically coupled to the transparent conductive oxide layer. In some embodiments, the gate grid may further include a DBR structure coupled to the transparent conductive oxide layer, and a through-via in the DBR structure, the through-via electrically coupling the metal layer to the transparent conductive oxide layer.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 5A illustrates an example of a near-eye display device including a waveguide display according to certain embodiments.

FIG. 5B illustrates an example of a near-eye display device including a waveguide display according to certain embodiments.

FIGS. 11A-11B illustrate an example of a field-effect micro-LED device including a gate grid for field-effect isolation of individual micro-LEDs of an array of micro-LEDs according to certain embodiments.

FIGS. 15A-15B illustrate an example of a process of fabricating a field-effect micro-LED device according to certain embodiments.

FIG. 18A illustrates an example of a method of die-to-wafer bonding for arrays of LEDs according to certain embodiments.

FIG. 18B illustrates an example of a method of wafer-to-wafer bonding for arrays of LEDs according to certain embodiments.

FIGS. 19A-19D illustrates an example of a method of hybrid bonding for arrays of LEDs according to certain embodiments.

Figure 1:
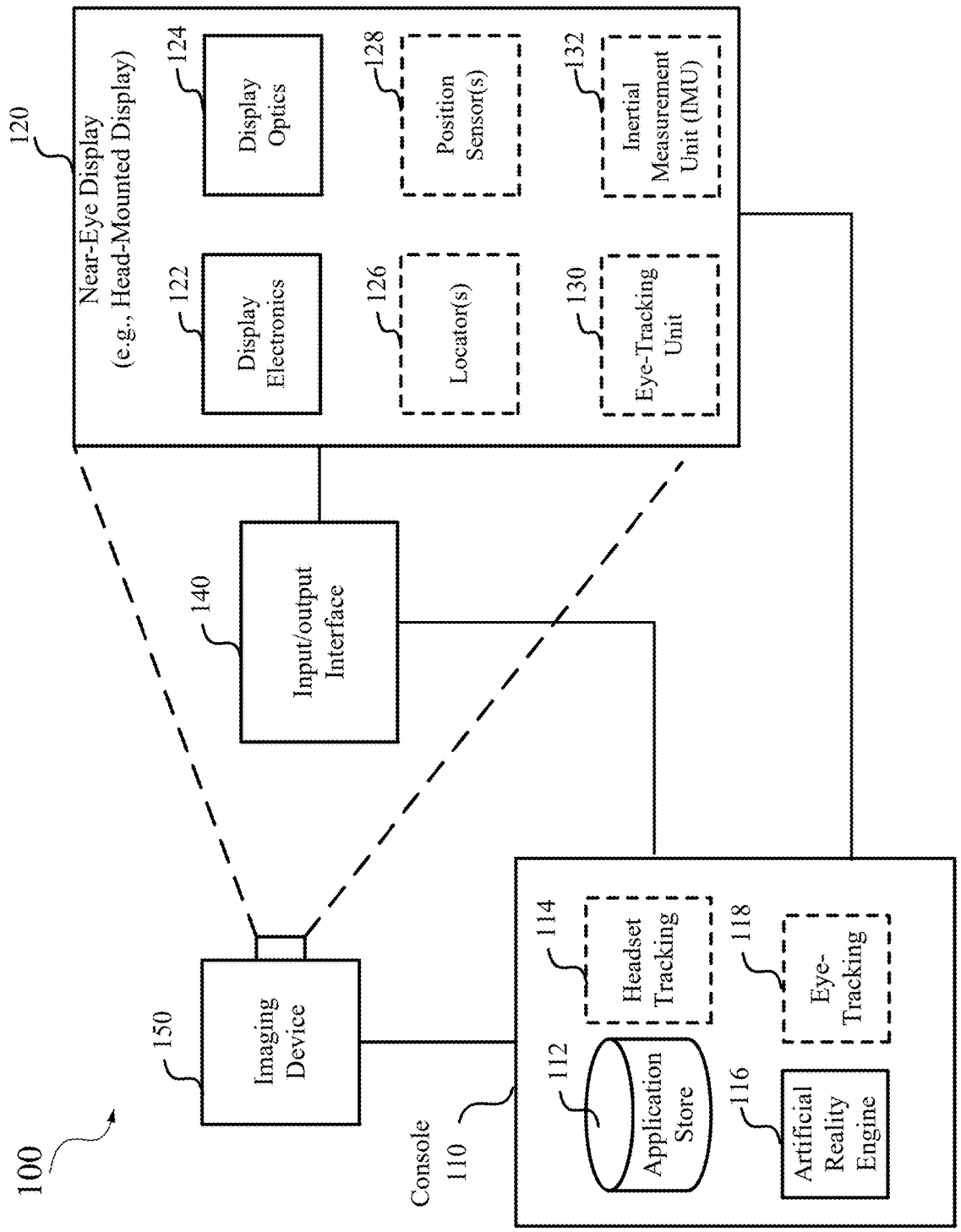
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to micro-light emitting diodes (micro-LEDs). More specifically, this disclosure relates to micro-LED devices including field-effect isolations between individual micro-LEDs for non-radiative recombination reduction. Various inventive embodiments are described herein, including devices, systems, methods, structures, materials, processes, and the like.

Augmented reality (AR) and virtual reality (VR) applications may use near-eye displays that include tiny monochrome light emitters, such as mini- or micro-LEDs. In light emitting diodes (LEDs), photons may be generated through the recombination of electrons and holes within an active region (e.g., including one or more quantum well layers and two or more quantum barrier layers that may form one or more quantum wells). The proportion of the carriers (e.g., electrons or holes) injected into the active region of an LED among the carriers that pass through the LED is referred to as the carrier injection efficiency. The ratio between the number of emitted photons and the number of carriers injected into the active region is referred to as the internal quantum efficiency (IQE) of the LED. Light emitted in the active region may be extracted from the LED at a certain light extraction efficiency (LEE). The ratio between the number of emitted photons extracted from the LED and the number of electrons passing through the LED is referred to as the external quantum efficiency (EQE) of the LED, which describes how efficiently the LED converts injected carriers into photons that are extracted from the LED. The EQE may be a product of the carrier injection efficiency, the IQE, and the LEE.

The internal quantum efficiency of an LED depends on the relative rates of competitive radiative (light producing) recombination and non-radiative (lossy) recombination that occur in the active region of the LED. Non-radiative recombination processes in the active region include Shockley-Read-Hall (SRH) recombination at defect sites, and electron-electron-hole (eeh) and/or electron-hole-hole (ehh) Auger recombination. The Auger recombination is a non-radiative process involving three carriers, which affects LEDs of all sizes. For LEDs fabricated by etching epitaxial layers to form LED mesa structures for individual LEDs, the IQEs and EQEs of the LEDs may be low due to, for example, high defect densities at the sidewalls of the LED mesa structures caused by the abrupt ending of the lattice structure, chemical contamination, and/or structural damages.

For example, in plasma etching, high-energy ions (e.g., $Ar^+$, $Cl_2^+$, $Cl^+$, or $HF^+$) may be used to bombard the exposed surfaces of semiconductor epitaxial layers. Because of the bombardment by high-energy particles, the surfaces created by the etching may be highly damaged, where the damages may include alterations to the crystal structure or other modifications to the surfaces. The damages may extend into the interior of the mesa structure, such as about 50 nm to about 500 nm or more below the surfaces formed by the etching. Therefore, the active region in proximity to the sidewalls of the mesa structure may have a high density of defects, such as lattice dislocations, dangling bonds, pores, grain boundaries, vacancies, surface oxides, surfaces modifications by plasma atoms, interstitial defects, substitutional defects, inclusion of precipitates, and the like. The defects may introduce energy states having deep or shallow energy levels in the bandgap. Carriers may be trapped by these energy states until they recombine non-radiatively. Therefore, the active region in proximity to the sidewalls of the mesa structure may have a higher rate of nonradiative recombination, which may reduce the efficiency of the LED.

In micro-LEDs, the mesa structures may have very small sizes, such as with a width less than about 10 µm, less than about 5 µm, less than about 3 µm, or less than about 2 µm. As such, the lateral size (e.g., diameter or width) of each micro-LED may be comparable to the minority carrier diffusion length. Therefore, a larger proportion of the total active region may be within the minority carrier diffusion length from the sidewall surfaces where the defect density and thus the defect-induced non-radiative recombination rate may be high. As a result, a larger proportion of the injected carriers may diffuse to the regions near the sidewall surfaces, where the carriers may be subjected to a higher SRH recombination rate. This may cause the efficiency of the micro-LED to decrease (in particular, at low current injection), cause the peak efficiency of the micro-LED to decrease, and/or cause the peak efficiency operating current to increase. Increasing the injected current may cause the efficiencies of the micro-LEDs to drop due to the higher eeh or ehh Auger recombination rate at a higher current density, and may also cause spectral shift of the emitted light. As the physical sizes of micro-LEDs are further reduced, efficiency losses due to surface recombination near the etched sidewall surfaces that include surface imperfections may become much more significant. III-phosphide materials, such as AlGaInP, can have a high surface recombination velocity and minority carrier diffusion length. For example, carriers in AlGaInP can have high diffusivity (mobility), and AlGaInP may have a surface recombination velocity that may be an order of magnitude higher than surface recombination velocities of III-nitride materials. Thus, the internal and external quantum efficiencies of AlGaInP-based red light-emitting micro-LEDs may drop even more significantly as the device size reduces.

According to certain embodiments, to avoid the non-radiative recombination at sidewalls of individual micro-LED mesa structures formed by etching epitaxial layers that include the light-emitting active layers, thereby improving the efficiencies of the micro-LEDs, field-effect isolations formed by electrically depleting at least one type of carriers (e.g., holes) in regions of the active layers surrounding a light-emitting region of each micro-LED may be used to isolate the active layers into individual micro-LEDs during operations of a micro-LED device. Since the active layers are electrically isolated during operations, rather than being physically and/or chemically etched, to form individual micro-LEDs, there would not be high-defect-density sidewall regions in the active layers of the individual micro-LEDs. As such, non-radiative recombination in the active layers can be reduced and the quantum efficiencies of the micro-LEDs can be improved significantly, in particular, for micro-LEDs with small pitches and small active regions.

In one example, the field-effect isolations may be formed by applying, through a gate grid and an insulator grid that surround the light-emitting region of each micro-LED, an electric field to a cladding layer (e.g., p-cladding layer) and active layers to deplete holes in the p-cladding layer and accumulate electrons in the active layers under the gate grid. Increasing the electron density by accumulating electrons in the active layers under the gate grid may reduce the minority carrier (e.g., hole) diffusion length (e.g., to sub-micron ranges) and prevent the minority carriers (e.g., holes) injected by an electrode (e.g., anode) of a micro-LED from diffusing to neighboring micro-LEDs. The gate voltage for all micro-LEDs can be at a same voltage level or similar voltage levels, and there may be no or very low gate current due to the insulator grid. As such, the field-effect isolations can be achieved using a gate grid that is biased to a common voltage level, without using a current driver. The gate grid may be a common gate grid (e.g., including electrically and/or physically shorted columns and rows) for all micro-LEDs, or may include individual structures (e.g., rectangular or circular rings) for respective micro-LEDs. The barrier layer under the gate grid may be thin, such that the field-effect isolations may be achieved using a gate voltage that is not too high.

In some embodiments, to further reduce the gate voltage for depleting the cladding layer and increasing the electron density in the active layers under the gate grid, the cladding layer under the gate grid may be thinned, such as partially etched using an etch-stop layer (e.g., an AlAs layer) without etching the active layers. In some embodiments, the cladding layer under the gate grid and the insulator grid may be very thin or may be completely removed, and thus the gate voltage for generating the field-effect isolations can be low and can be provided by the forward driving voltage of the micro-LEDs. As such, the gate grid for each micro-LED may be shorted to the anode of the micro-LED, and no additional gate control signal may be needed. In some embodiments, the gate voltage may be decreased by using higher bandgap cladding layers to increase the electron density in the active layers under the gate grid.

The micro-LEDs described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using an LED-based display subsystem.

As used herein, the term "light emitting diode (LED)" refers to a light source that includes at least an n-type semiconductor layer, a p-type semiconductor layer, and a light emitting region (i.e., active region) between the n-type semiconductor layer and the p-type semiconductor layer. The light emitting region may include one or more semiconductor layers that form one or more heterostructures, such as quantum wells. In some embodiments, the light emitting region may include multiple semiconductor layers that form one or more multiple-quantum-wells (MQWs), each including multiple (e.g., about 2 to 6) quantum wells.

As used herein, the term "micro-LED" or "µLED" refers to an LED that has a chip where a linear dimension of the chip is less than about 200 µm, such as less than 100 µm, less than 50 µm, less than 20 µm, less than 10 µm, or smaller. For example, the linear dimension of a micro-LED may be as small as 6 µm, 5 µm, 4 µm, 2 µm, or smaller. Some micro-LEDs may have a linear dimension (e.g., length or diameter) comparable to the minority carrier diffusion length. However, the disclosure herein is not limited to micro-LEDs, and may also be applied to mini-LEDs and large LEDs.

As used herein, the term "LED array precursor" refers to an LED die or wafer that does not have the opposing electrical contacts and/or the associated drive circuitry for each LED such that a driving voltage or current may be applied to the LED for the LED to emit light. For example, an LED array precursor may be a wafer or die with an epitaxial layer stack that may or may not include the light emitting regions, a wafer or die with mesa structures formed in the epitaxial layer stack, a wafer or die with LED arrays and metal contacts formed thereon but without the drive circuitry, and the like. Accordingly, the LED die or wafer is a precursor to a monolithic LED array that may be formed after subsequent processing steps are performed, such as forming mesa structures, forming metal electrodes, bonding to electrical backplane, removing the substrate, forming light-extraction structures, or the like.

As used herein, the term "bonding" may refer to various methods for physically and/or electrically connecting two or more devices and/or wafers, such as adhesive bonding, metal-to-metal bonding, metal oxide bonding, wafer-to-wafer bonding, die-to-wafer bonding, hybrid bonding, soldering, under-bump metallization, and the like. For example, adhesive bonding may use a curable adhesive (e.g., an epoxy) to physically bond two or more devices and/or wafers through adhesion. Metal-to-metal bonding may include, for example, wire bonding or flip chip bonding using soldering interfaces (e.g., pads or balls), conductive adhesive, or welded joints between metals. Metal oxide bonding may form a metal and oxide pattern on each surface, bond the oxide sections together, and then bond the metal sections together to create a conductive path. Wafer-to-wafer bonding may bond two wafers (e.g., silicon wafers or other semiconductor wafers) without any intermediate layers and is based on chemical bonds between the surfaces of the two wafers. Wafer-to-wafer bonding may include wafer cleaning and other preprocessing, aligning and pre-bonding at room temperature, and annealing at elevated temperatures, such as about 250° C. or higher. Die-to-wafer bonding may use bumps on one wafer to align features of a pre-formed chip with drivers of a wafer. Hybrid bonding may include, for example, wafer cleaning, high-precision alignment of contacts of one wafer with contacts of another wafer, dielectric bonding of dielectric materials within the wafers at room temperature, and metal bonding of the contacts by annealing at, for example, 250-300° C. or higher. As used herein, the term "bump" may refer generically to a metal interconnect used or formed during bonding.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (µLED) display, an active-matrix OLED display (AMOLED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an antireflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be a light-emitting diode (LED), a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 12 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 120 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking subsystem 114, an artificial reality engine 116, and an eye-tracking subsystem 118. Some embodiments of console 110 may include different or additional devices or subsystems than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the devices or subsystems of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking subsystem 114 may track movements of near-eye display 120 using slow calibration information from external imaging device 150. For example, headset tracking subsystem 114 may determine positions of a reference point of near-eye display 120 using observed locators from the slow calibration information and a model of near-eye display 120. Headset tracking subsystem 114 may also determine positions of a reference point of near-eye display 120 using position information from the fast calibration information. Additionally, in some embodiments, headset tracking subsystem 114 may use portions of the fast calibration information, the slow calibration information, or any combination thereof, to predict a future location of near-eye display 120. Headset tracking subsystem 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking subsystem 114. Artificial reality engine 116 may also receive estimated eye position and orientation information from eye-tracking subsystem 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking subsystem 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking subsystem 118 to more accurately determine the eye's orientation.

Figure 2:
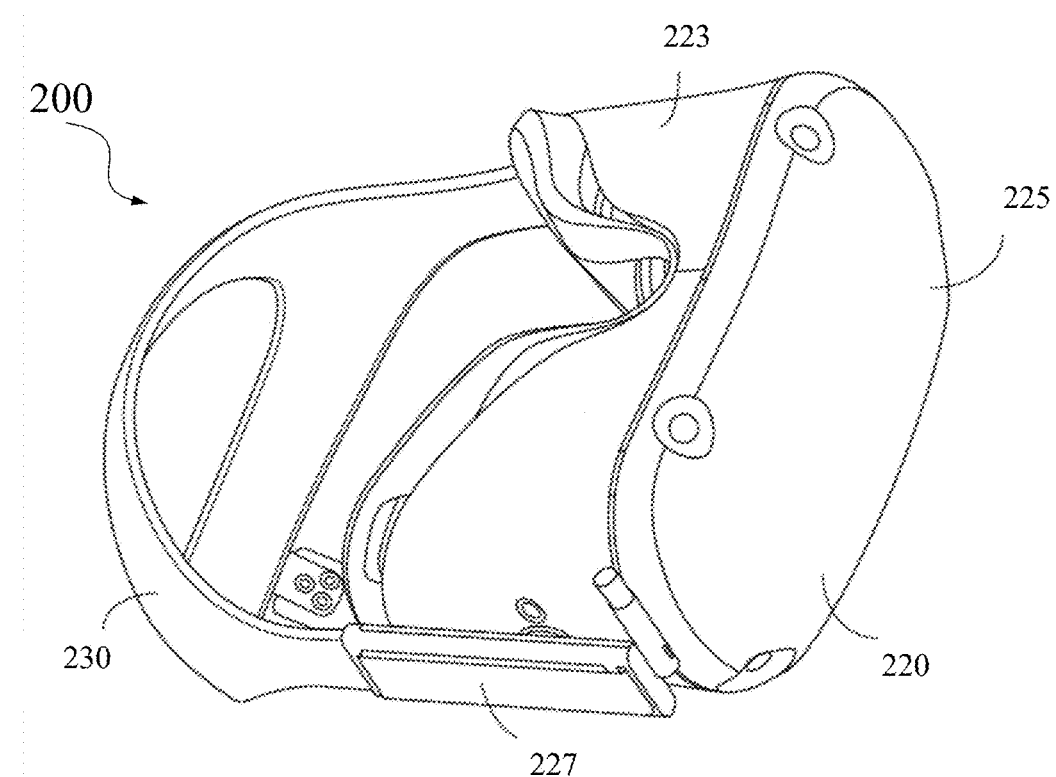
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a μLED display, an AMOLED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
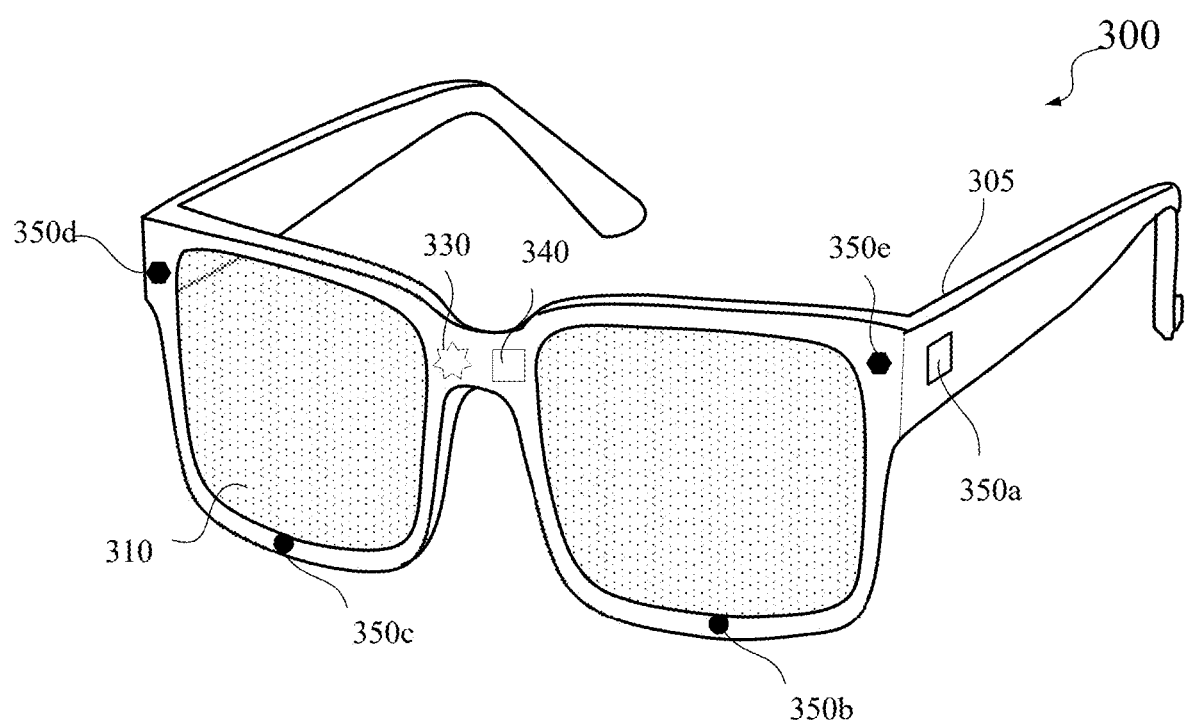
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light patterns onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

Figure 4:
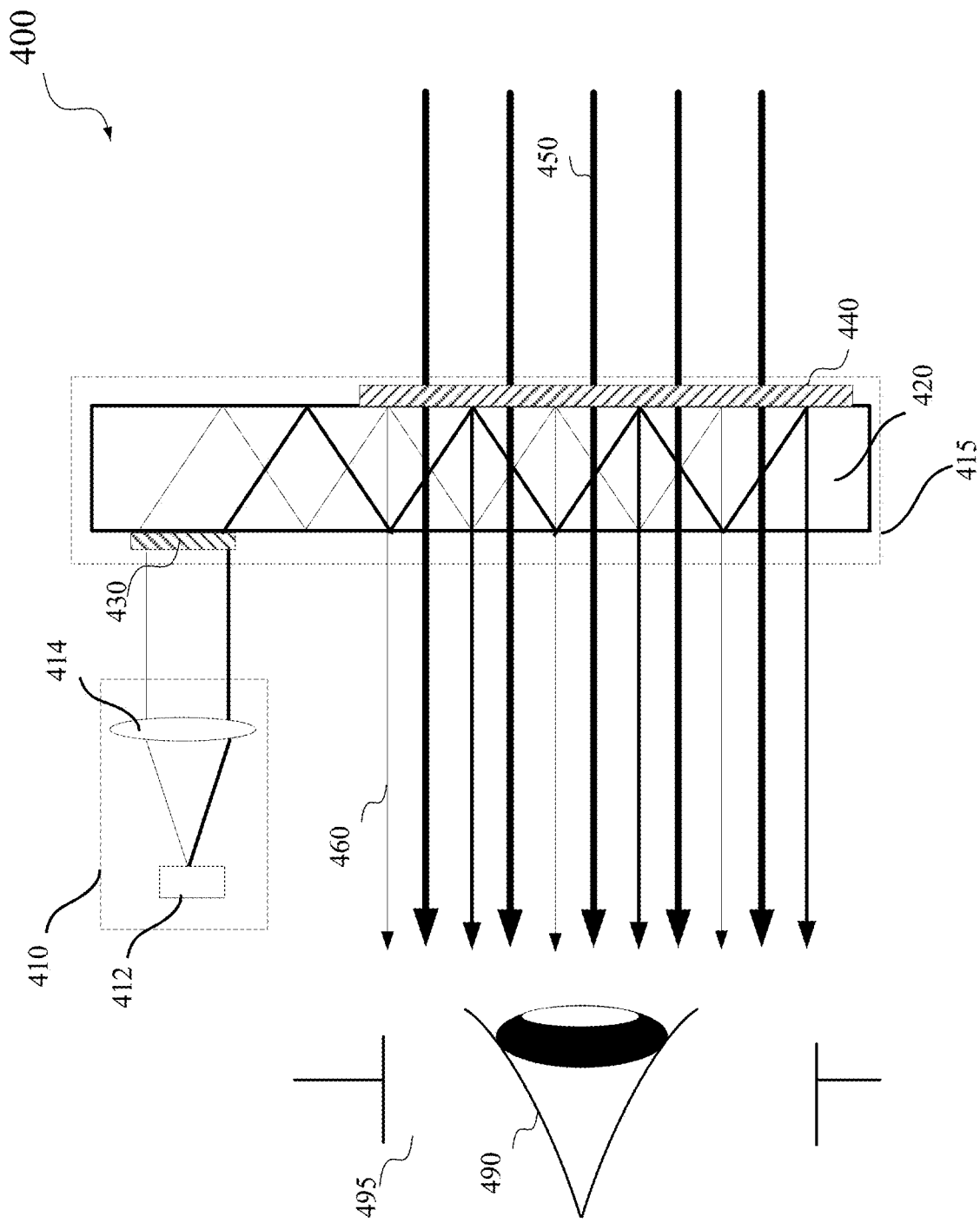
FIG. 4 illustrates an example of an optical see-through augmented reality system including a waveguide display according to certain embodiments.

FIG. 4 illustrates an example of an optical see-through augmented reality system 400 including a waveguide display according to certain embodiments. Augmented reality system 400 may include a projector 410 and a combiner 415. Projector 410 may include a light source or image source 412 and projector optics 414. In some embodiments, light source or image source 412 may include one or more micro-LED devices described above. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, an LED, and/or a micro-LED described above. In some embodiments, image source 412 may include a plurality of light sources (e.g., an array of micro-LEDs described above), each emitting a monochromatic image light corresponding to a primary color (e.g., red, green, or blue). In some embodiments, image source 412 may include three two-dimensional arrays of micro-LEDs, where each two-dimensional array of micro-LEDs may include micro-LEDs configured to emit light of a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. For example, in some embodiments, image source 412 may include one or more one-dimensional arrays or elongated two-dimensional arrays of micro-LEDs, and projector optics 414 may include one or more one-dimensional scanners (e.g., micro-mirrors or prisms) configured to scan the one-dimensional arrays or elongated two-dimensional arrays of micro-LEDs to generate image frames. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Input coupler 430 may include a volume holographic grating, a diffractive optical element (DOE) (e.g., a surface-relief grating), a slanted surface of substrate 420, or a refractive coupler (e.g., a wedge or a prism). For example, input coupler 430 may include a reflective volume Bragg grating or a transmissive volume Bragg grating. Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 420 may be transparent to visible light.

Substrate 420 may include or may be coupled to a plurality of output couplers 440, each configured to extract at least a portion of the light guided by and propagating within substrate 420 from substrate 420, and direct extracted light 460 to an eyebox 495 where an eye 490 of the user of augmented reality system 400 may be located when augmented reality system 400 is in use. The plurality of output couplers 440 may replicate the exit pupil to increase the size of eyebox 495 such that the displayed image is visible in a larger area. As input coupler 430, output couplers 440 may include grating couplers (e.g., volume holographic gratings or surface-relief gratings), other diffraction optical elements (DOEs), prisms, etc. For example, output couplers 440 may include reflective volume Bragg gratings or transmissive volume Bragg gratings. Output couplers 440 may have different coupling (e.g., diffraction) efficiencies at different locations. Substrate 420 may also allow light 450 from the environment in front of combiner 415 to pass through with little or no loss. Output couplers 440 may also allow light 450 to pass through with little loss. For example, in some implementations, output couplers 440 may have a very low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 in certain desired directions (i.e., diffraction angles) with little loss. As a result, the user may be able to view combined images of the environment in front of combiner 415 and images of virtual objects projected by projector 410.

FIG. 5A illustrates an example of a near-eye display (NED) device 500 including a waveguide display 530 according to certain embodiments. NED device 500 may be an example of near-eye display 120, augmented reality system 400, or another type of display device. NED device 500 may include a light source 510, projection optics 520, and waveguide display 530. Light source 510 may include multiple panels of light emitters for different colors, such as a panel of red light emitters 512, a panel of green light emitters 514, and a panel of blue light emitters 516. The red light emitters 512 are organized into an array; the green light emitters 514 are organized into an array; and the blue light emitters 516 are organized into an array. The dimensions and pitches of light emitters in light source 510 may be small. For example, each light emitter may have a diameter less than 2 µm (e.g., about 1.2 µm) and the pitch may be less than 2 µm (e.g., about 1.5 µm). As such, the number of light emitters in each red light emitters 512, green light emitters 514, and blue light emitters 516 can be equal to or greater than the number of pixels in a display image, such as 960×720, 1280×720, 1440×1080, 1920×1080, 2160×1080, or 2560×1080 pixels. Thus, a display image may be generated simultaneously by light source 510. A scanning element may not be used in NED device 500.

Before reaching waveguide display 530, the light emitted by light source 510 may be conditioned by projection optics 520, which may include a lens array. Projection optics 520 may collimate or focus the light emitted by light source 510 to waveguide display 530, which may include a coupler 532 for coupling the light emitted by light source 510 into waveguide display 530. The light coupled into waveguide display 530 may propagate within waveguide display 530 through, for example, total internal reflection as described above with respect to FIG. 4. Coupler 532 may also couple portions of the light propagating within waveguide display 530 out of waveguide display 530 and towards user's eye 590.

FIG. 5B illustrates an example of a near-eye display (NED) device 550 including a waveguide display 580 according to certain embodiments. In some embodiments, NED device 550 may use a scanning mirror 570 to project light from a light source 540 to an image field where a user's eye 590 may be located. NED device 550 may be an example of near-eye display 120, augmented reality system 400, or another type of display device. Light source 540 may include one or more rows or one or more columns of light emitters of different colors, such as multiple rows of red light emitters 542, multiple rows of green light emitters 544, and multiple rows of blue light emitters 546. For example, red light emitters 542, green light emitters 544, and blue light emitters 546 may each include N rows, each row including, for example, 2560 light emitters (pixels). The red light emitters 542 are organized into an array; the green light emitters 544 are organized into an array; and the blue light emitters 546 are organized into an array. In some embodiments, light source 540 may include a single line of light emitters for each color. In some embodiments, light source 540 may include multiple columns of light emitters for each of red, green, and blue colors, where each column may include, for example, 1080 light emitters. In some embodiments, the dimensions and/or pitches of the light emitters in light source 540 may be relatively large (e.g., about 3-5 μm) and thus light source 540 may not include sufficient light emitters for simultaneously generating a full display image. For example, the number of light emitters for a single color may be fewer than the number of pixels (e.g., 2560×1080 pixels) in a display image. The light emitted by light source 540 may be a set of collimated or diverging beams of light.

Before reaching scanning mirror 570, the light emitted by light source 540 may be conditioned by various optical devices, such as collimating lenses or a freeform optical element 560. Freeform optical element 560 may include, for example, a multi-facet prism or another light folding element that may direct the light emitted by light source 540 towards scanning mirror 570, such as changing the propagation direction of the light emitted by light source 540 by, for example, about 900 or larger. In some embodiments, freeform optical element 560 may be rotatable to scan the light. Scanning mirror 570 and/or freeform optical element 560 may reflect and project the light emitted by light source 540 to waveguide display 580, which may include a coupler 582 for coupling the light emitted by light source 540 into waveguide display 580. The light coupled into waveguide display 580 may propagate within waveguide display 580 through, for example, total internal reflection as described above with respect to FIG. 4. Coupler 582 may also couple portions of the light propagating within waveguide display 580 out of waveguide display 580 and towards user's eye 590.

Scanning mirror 570 may include a microelectromechanical system (MEMS) mirror or any other suitable mirrors. Scanning mirror 570 may rotate to scan in one or two dimensions. As scanning mirror 570 rotates, the light emitted by light source 540 may be directed to a different area of waveguide display 580 such that a full display image may be projected onto waveguide display 580 and directed to user's eye 590 by waveguide display 580 in each scanning cycle. For example, in embodiments where light source 540 includes light emitters for all pixels in one or more rows or columns, scanning mirror 570 may be rotated in the column or row direction (e.g., x or y direction) to scan an image. In embodiments where light source 540 includes light emitters for some but not all pixels in one or more rows or columns, scanning mirror 570 may be rotated in both the row and column directions (e.g., both x and y directions) to project a display image (e.g., using a raster-type scanning pattern).

NED device 550 may operate in predefined display periods. A display period (e.g., display cycle) may refer to a duration of time in which a full image is scanned or projected. For example, a display period may be a reciprocal of the desired frame rate. In NED device 550 that includes scanning mirror 570, the display period may also be referred to as a scanning period or scanning cycle. The light generation by light source 540 may be synchronized with the rotation of scanning mirror 570. For example, each scanning cycle may include multiple scanning steps, where light source 540 may generate a different light pattern in each respective scanning step.

In each scanning cycle, as scanning mirror 570 rotates, a display image may be projected onto waveguide display 580 and user's eye 590. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 570 may revert back to the initial position to project light for the first few rows of the next display image or may rotate in a reverse direction or scan pattern to project light for the next display image, where a new set of driving signals may be fed to light source 540. The same process may be repeated as scanning mirror 570 rotates in each scanning cycle. As such, different images may be projected to user's eye 590 in different scanning cycles.

Figure 6:
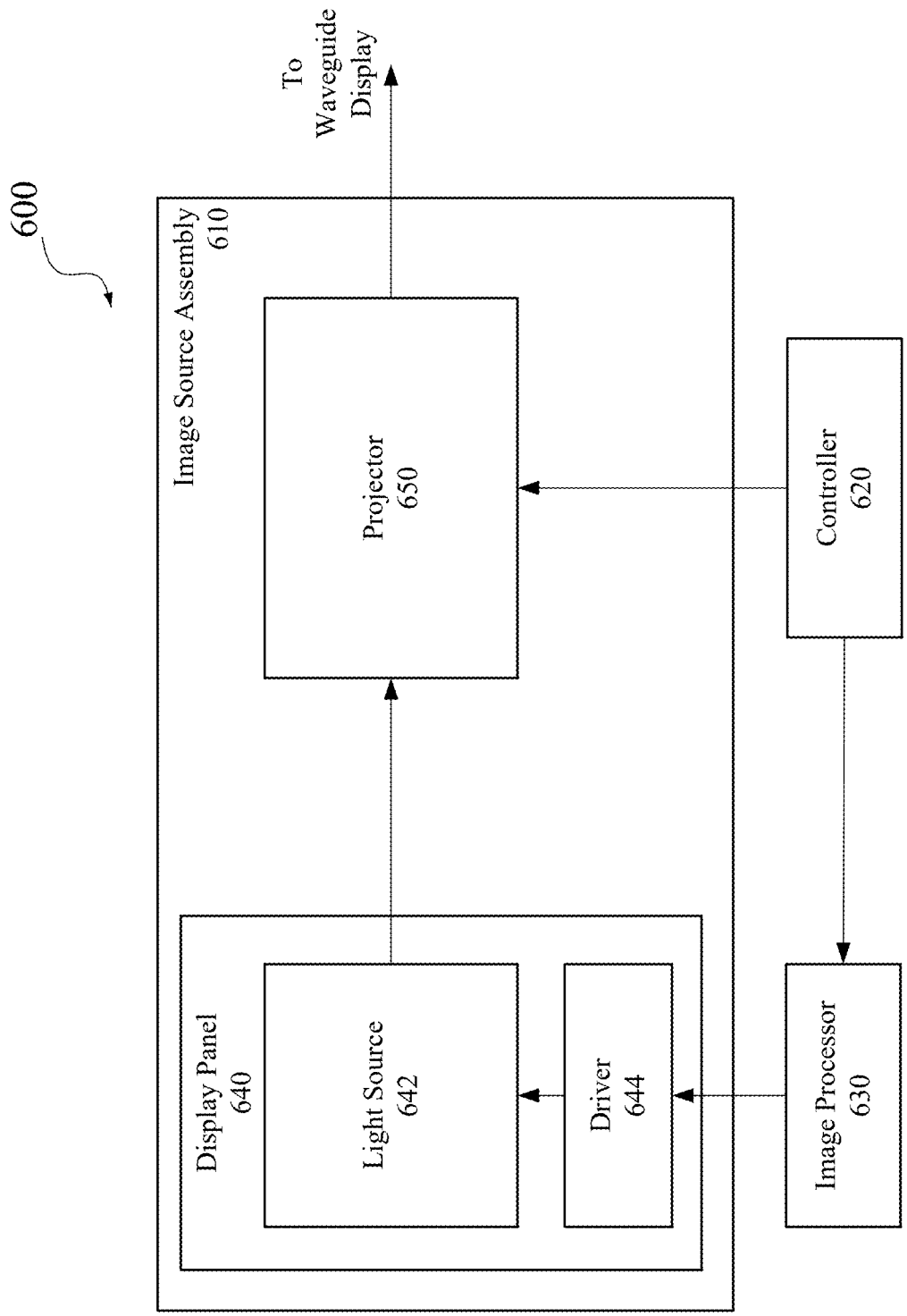
FIG. 6 illustrates an example of an image source assembly in an augmented reality system according to certain embodiments.

FIG. 6 illustrates an example of an image source assembly 610 in a near-eye display system 600 according to certain embodiments. Image source assembly 610 may include, for example, a display panel 640 that may generate display images to be projected to the user's eyes, and a projector 650 that may project the display images generated by display panel 640 to a waveguide display as described above with respect to FIGS. 4-5B. Display panel 640 may include a light source 642 and a drive circuit 644 for light source 642. Light source 642 may include, for example, light source 510 or 540. Projector 650 may include, for example, freeform optical element 560, scanning mirror 570, and/or projection optics 520 described above. Near-eye display system 600 may also include a controller 620 that synchronously controls light source 642 and projector 650 (e.g., scanning mirror 570). Image source assembly 610 may generate and output an image light to a waveguide display (not shown in FIG. 6), such as waveguide display 530 or 580. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 642 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of near-eye display system 600. In some embodiments, a display panel in accordance with an embodiment may use more than three primary colors. Each pixel in light source 642 may include three subpixels that include a red micro-LED, a green micro-LED, and a blue micro-LED. A semiconductor LED generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 620 may control the image rendering operations of image source assembly 610, such as the operations of light source 642 and/or projector 650. For example, controller 620 may determine instructions for image source assembly 610 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1. The scanning instructions may be used by image source assembly 610 to generate image light. The scanning instructions may specify, for example, a type of a source of image light (e.g., monochromatic or polychromatic), a scanning rate, an orientation of a scanning apparatus, one or more illumination parameters, or any combination thereof. Controller 620 may include a combination of hardware, software, and/or firmware not shown here so as not to obscure other aspects of the present disclosure.

In some embodiments, controller 620 may be a graphics processing unit (GPU) of a display device. In other embodiments, controller 620 may be other kinds of processors. The operations performed by controller 620 may include taking content for display and dividing the content into discrete sections. Controller 620 may provide to light source 642 scanning instructions that include an address corresponding to an individual source element of light source 642 and/or an electrical bias applied to the individual source element. Controller 620 may instruct light source 642 to sequentially present the discrete sections using light emitters corresponding to one or more rows of pixels in an image ultimately displayed to the user. Controller 620 may also instruct projector 650 to perform different adjustments of the light. For example, controller 620 may control projector 650 to scan the discrete sections to different areas of a coupling element of the waveguide display (e.g., waveguide display 580) as described above with respect to FIG. 5B. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 630 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 630 may be one or more circuits that are dedicated to performing certain features. While image processor 630 in FIG. 6 is shown as a stand-alone unit that is separate from controller 620 and drive circuit 644, image processor 630 may be a sub-unit of controller 620 or drive circuit 644 in other embodiments. In other words, in those embodiments, controller 620 or drive circuit 644 may perform various image processing functions of image processor 630. Image processor 630 may also be referred to as an image processing circuit.

In the example shown in FIG. 6, light source 642 may be driven by drive circuit 644, based on data or instructions (e.g., display and scanning instructions) sent from controller 620 or image processor 630. In one embodiment, drive circuit 644 may include a circuit panel that connects to and mechanically holds various light emitters of light source 642. Light source 642 may emit light in accordance with one or more illumination parameters that are set by the controller 620 and potentially adjusted by image processor 630 and drive circuit 644. An illumination parameter may be used by light source 642 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 642 may include multiple beams of red light, green light, and blue light, or any combination thereof.

Projector 650 may perform a set of optical functions, such as focusing, combining, conditioning, or scanning the image light generated by light source 642. In some embodiments, projector 650 may include a combining assembly, a light conditioning assembly, or a scanning mirror assembly. Projector 650 may include one or more optical components that optically adjust and potentially re-direct the light from light source 642. One example of the adjustment of light may include conditioning the light, such as expanding, collimating, correcting for one or more optical errors (e.g., field curvature, chromatic aberration, etc.), some other adjustments of the light, or any combination thereof. The optical components of projector 650 may include, for example, lenses, mirrors, apertures, gratings, or any combination thereof.

Projector 650 may redirect image light via its one or more reflective and/or refractive portions so that the image light is projected at certain orientations toward the waveguide display. The location where the image light is redirected toward the waveguide display may depend on specific orientations of the one or more reflective and/or refractive portions. In some embodiments, projector 650 includes a single scanning mirror that scans in at least two dimensions. In other embodiments, projector 650 may include a plurality of scanning mirrors that each scan in directions orthogonal to each other. Projector 650 may perform a raster scan (horizontally or vertically), a bi-resonant scan, or any combination thereof. In some embodiments, projector 650 may perform a controlled vibration along the horizontal and/or vertical directions with a specific frequency of oscillation to scan along two dimensions and generate a two-dimensional projected image of the media presented to user's eyes. In other embodiments, projector 650 may include a lens or prism that may serve similar or the same function as one or more scanning mirrors. In some embodiments, image source assembly 610 may not include a projector, where the light emitted by light source 642 may be directly incident on the waveguide display.

The overall efficiency of a photonic integrated circuit or a waveguide-based display (e.g., in augmented reality system 400 or NED device 500 or 550) may be a product of the efficiency of individual components and may also depend on how the components are connected. For example, the overall efficiency $\eta_{tot}$ of the waveguide-based display in augmented reality system 400 may depend on the light emitting efficiency of image source 412, the light coupling efficiency from image source 412 into combiner 415 by projector optics 414 and input coupler 430, and the output coupling efficiency of output coupler 440, and thus may be determined as:

$$\eta_{tot} = \eta_{EQE} \times \eta_{in} \times \eta_{out}, \quad (1)$$

where $\eta_{EQE}$ is the external quantum efficiency of image source 412, $\eta_{in}$ is the in-coupling efficiency of light from image source 412 into the waveguide (e.g., substrate 420), and $\eta_{out}$ is the outcoupling efficiency of light from the waveguide towards the user's eye by output coupler 440. Thus, the overall efficiency $\eta_{tot}$ of the waveguide-based display can be improved by improving one or more of $\eta_{EQE}$, $\eta_{in}$, and $\eta_{out}$.

The optical coupler (e.g., input coupler 430 or coupler 532) that couples the emitted light from a light source to a waveguide may include, for example, a grating, a lens, a micro-lens, a prism. In some embodiments, light from a small light source (e.g., a micro-LED) can be directly (e.g., end-to-end) coupled from the light source to a waveguide, without using an optical coupler. In some embodiments, the optical coupler (e.g., a lens or a parabolic-shaped reflector) may be manufactured on the light source.

The light sources, image sources, or other displays described above may include one or more LEDs. For example, each pixel in a display may include three subpixels that include a red micro-LED, a green micro-LED, and a blue micro-LED. A semiconductor light emitting diode generally includes an active light emitting layer within multiple layers of semiconductor materials. The multiple layers of semiconductor materials may include different compound materials or a same base material with different dopants and/or different doping densities. For example, the multiple layers of semiconductor materials may generally include an n-type material layer, an active layer that may include hetero-structures (e.g., one or more quantum wells), and a p-type material layer. The multiple layers of semiconductor materials may be grown on a surface of a substrate having a certain orientation. Photons can be generated in the active layer at a certain internal quantum efficiency through the recombination of electrons and holes within the active layer (e.g., including one or more semiconductor layers). The generated light may then be extracted from the LEDs in a particular direction or within a particular solid angle and coupled into a waveguide and/or projected to the user's eyes.

Figure 7A:
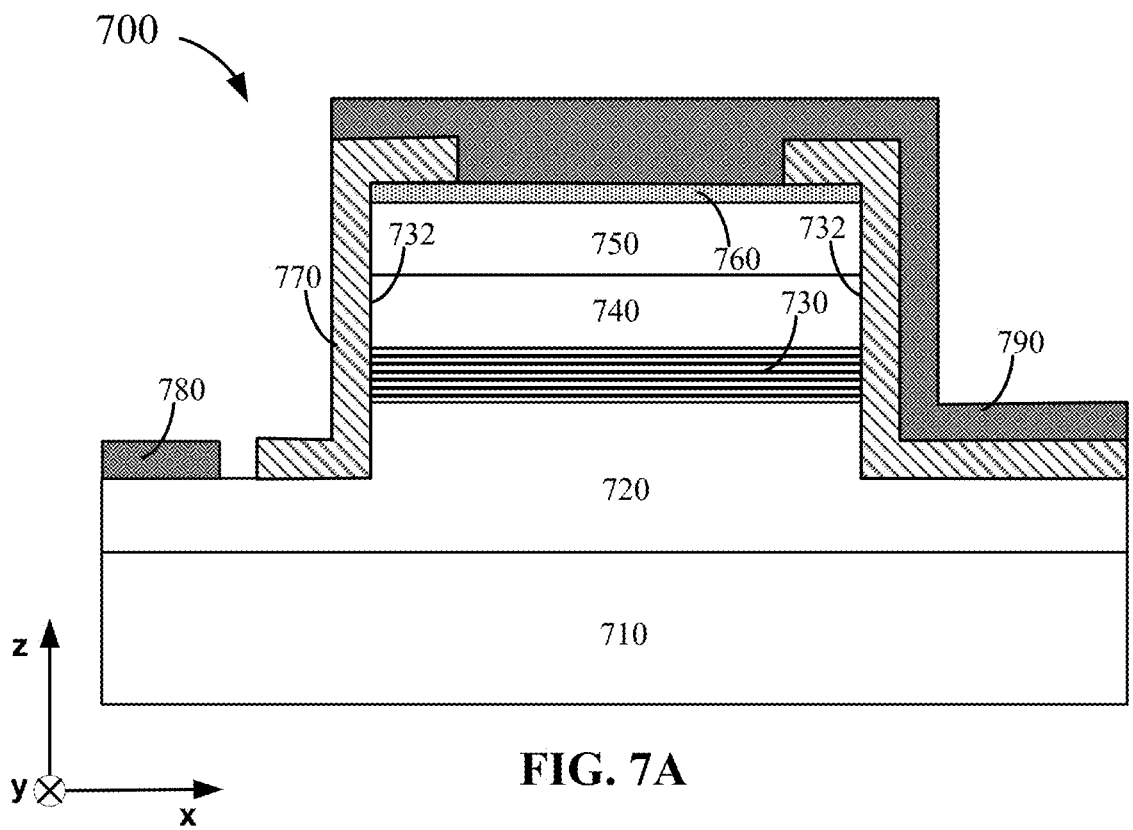
FIG. 7A illustrates an example of a light emitting diode (LED) having a vertical mesa structure according to certain embodiments.

FIG. 7A illustrates an example of an LED 700 having a vertical mesa structure. LED 700 may be a light emitter in light source 510, 540, or 642. LED 700 may be a micro-LED made of inorganic materials, such as multiple layers of semiconductor materials. The layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation (e.g., polar, nonpolar, or semi-polar orientation), such as a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-LiAlO$_2$ structure, where the substrate may be cut in a specific direction to expose a specific plane as the growth surface.

In the example shown in FIG. 7A, LED 700 may include a substrate 710, which may include, for example, a sapphire substrate or a GaN substrate. A semiconductor layer 720 may be grown on substrate 710. Semiconductor layer 720 may include a III-V material, such as GaN, and may be p-doped (e.g., with Mg, Ca, Zn, or Be) or n-doped (e.g., with Si or Ge). One or more active layers 730 may be grown on semiconductor layer 720 to form an active region. Active layer 730 may include III-V materials, such as one or more InGaN layers, one or more AlInGaP layers, and/or one or more GaN layers, which may form one or more heterostructures, such as one or more quantum wells or MQWs. A semiconductor layer 740 may be grown on active layer 730. Semiconductor layer 740 may include a III-V material, such as GaN, and may be p-doped (e.g., with Mg, Ca, Zn, or Be) or n-doped (e.g., with Si or Ge). One of semiconductor layer 720 and semiconductor layer 740 may be a p-type layer and the other one may be an n-type layer. Semiconductor layer 720 and semiconductor layer 740 sandwich active layer 730 to form the light emitting region. For example, LED 700 may include a layer of InGaN situated between a layer of p-type GaN doped with magnesium and a layer of n-type GaN doped with silicon or oxygen. In some embodiments, LED 700 may include a layer of AlInGaP situated between a layer of p-type AlInGaP doped with zinc or magnesium and a layer of n-type AlInGaP doped with selenium, silicon, or tellurium.

In some embodiments, an electron-blocking layer (EBL) (not shown in FIG. 7A) may be grown to form a layer between active layer 730 and at least one of semiconductor layer 720 or semiconductor layer 740. The EBL may reduce the electron leakage current and improve the efficiency of the LED. In some embodiments, a heavily-doped semiconductor layer 750, such as a P$^+$ or P$^{++}$ semiconductor layer, may be formed on semiconductor layer 740 and act as a contact layer for forming an ohmic contact and reducing the contact impedance of the device. In some embodiments, a conductive layer 760 may be formed on heavily-doped semiconductor layer 750. Conductive layer 760 may include, for example, an indium tin oxide (ITO) or Al/Ni/Au film. In one example, conductive layer 760 may include a transparent ITO layer.

To make contact with semiconductor layer 720 (e.g., an n-GaN layer) and to more efficiently extract light emitted by active layer 730 from LED 700, the semiconductor material layers (including heavily-doped semiconductor layer 750, semiconductor layer 740, active layer 730, and semiconductor layer 720) may be etched to expose semiconductor layer 720 and to form a mesa structure that includes layers 720-760. The mesa structure may confine the carriers within the device. Etching the mesa structure may lead to the formation of mesa sidewalls 732 that may be orthogonal to the growth planes. A passivation layer 770 may be formed on mesa sidewalls 732 of the mesa structure. Passivation layer 770 may include an oxide layer, such as a $SiO_2$ layer, and may act as a reflector to reflect emitted light out of LED 700. A contact layer 780, which may include a metal layer, such as Al, Au, Ni, Ti, or any combination thereof, may be formed on semiconductor layer 720 and may act as an electrode of LED 700. In addition, another contact layer 790, such as an Al/Ni/Au metal layer, may be formed on conductive layer 760 and may act as another electrode of LED 700.

When a voltage signal is applied to contact layers 780 and 790, electrons and holes may recombine in active layer 730, where the recombination of electrons and holes may cause photon emission. The wavelength and energy of the emitted photons may depend on the energy bandgap between the valence band and the conduction band in active layer 730. For example, InGaN active layers may emit green or blue light, AlGaN active layers may emit blue to ultraviolet light, while AlInGaP active layers may emit red, orange, yellow, or green light. The emitted photons may be reflected by passivation layer 770 and may exit LED 700 from the top (e.g., conductive layer 760 and contact layer 790) or bottom (e.g., substrate 710).

In some embodiments, LED 700 may include one or more other components, such as a lens, on the light emission surface, such as substrate 710, to focus or collimate the emitted light or couple the emitted light into a waveguide. In some embodiments, an LED may include a mesa of another shape, such as planar, conical, semi-parabolic, or parabolic, and a base area of the mesa may be circular, rectangular, hexagonal, or triangular. For example, the LED may include a mesa of a curved shape (e.g., paraboloid shape) and/or a non-curved shape (e.g., conic shape). The mesa may be truncated or non-truncated.

Figure 7B:
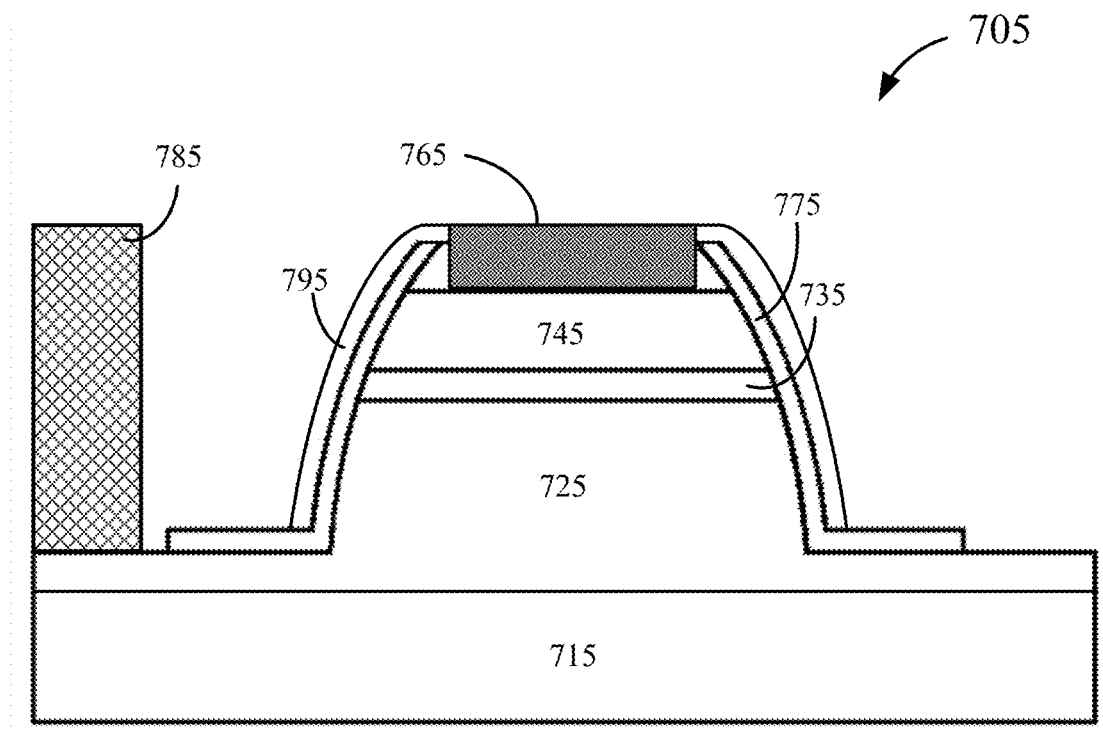
FIG. 7B is a cross-sectional view of an example of an LED having a parabolic mesa structure according to certain embodiments.

FIG. 7B is a cross-sectional view of an example of an LED 705 having a parabolic mesa structure. Similar to LED 700, LED 705 may include multiple layers of semiconductor materials, such as multiple layers of III-V semiconductor materials. The semiconductor material layers may be epitaxially grown on a substrate 715, such as a GaN substrate or a sapphire substrate. For example, a semiconductor layer 725 may be grown on substrate 715. Semiconductor layer 725 may include a III-V material, such as GaN, and may be p-doped (e.g., with Mg, Ca, Zn, or Be) or n-doped (e.g., with Si or Ge). One or more active layer 735 may be grown on semiconductor layer 725. Active layer 735 may include III-V materials, such as one or more InGaN layers, one or more AlInGaP layers, and/or one or more GaN layers, which may form one or more heterostructures, such as one or more quantum wells. A semiconductor layer 745 may be grown on active layer 735. Semiconductor layer 745 may include a III-V material, such as GaN, and may be p-doped (e.g., with Mg, Ca, Zn, or Be) or n-doped (e.g., with Si or Ge). One of semiconductor layer 725 and semiconductor layer 745 may be a p-type layer and the other one may be an n-type layer.

To make contact with semiconductor layer 725 (e.g., an n-type GaN layer) and to more efficiently extract light emitted by active layer 735 from LED 705, the semiconductor layers may be etched to expose semiconductor layer 725 and to form a mesa structure that includes layers 725-745. The mesa structure may confine carriers within the injection area of the device. Etching the mesa structure may lead to the formation of mesa side walls (also referred to herein as facets) that may be non-parallel with, or in some cases, orthogonal, to the growth planes associated with crystalline growth of layers 725-745.

As shown in FIG. 7B, LED 705 may have a mesa structure that includes a flat top. A dielectric layer 775 (e.g., $SiO_2$ or SiN) may be formed on the facets of the mesa structure. In some embodiments, dielectric layer 775 may include multiple layers of dielectric materials. In some embodiments, a metal layer 795 may be formed on dielectric layer 775. Metal layer 795 may include one or more metal or metal alloy materials, such as aluminum (Al), silver (Ag), gold (Au), platinum (Pt), titanium (Ti), copper (Cu), or any combination thereof. Dielectric layer 775 and metal layer 795 may form a mesa reflector that can reflect light emitted by active layer 735 toward substrate 715. In some embodiments, the mesa reflector may be parabolic-shaped to act as a parabolic reflector that may at least partially collimate the emitted light.

Electrical contact 765 and electrical contact 785 may be formed on semiconductor layer 745 and semiconductor layer 725, respectively, to act as electrodes. Electrical contact 765 and electrical contact 785 may each include a conductive material, such as Al, Au, Pt, Ag, Ni, Ti, Cu, or any combination thereof (e.g., Ag/Pt/Au or Al/Ni/Au), and may act as the electrodes of LED 705. In the example shown in FIG. 7B, electrical contact 785 may be an n-contact, and electrical contact 765 may be a p-contact. Electrical contact 765 and semiconductor layer 745 (e.g., a p-type semiconductor layer) may form a back reflector for reflecting light emitted by active layer 735 back toward substrate 715. In some embodiments, electrical contact 765 and metal layer 795 include same material(s) and can be formed using the same processes. In some embodiments, an additional conductive layer (not shown) may be included as an intermediate conductive layer between the electrical contacts 765 and 785 and the semiconductor layers.

When a voltage signal is applied across electrical contacts 765 and 785, electrons and holes may recombine in active layer 735. The recombination of electrons and holes may cause photon emission, thus producing light. The wavelength and energy of the emitted photons may depend on the energy bandgap between the valence band and the conduction band in active layer 735. For example, InGaN active layers may emit green or blue light, while AlInGaP active layers may emit red, orange, yellow, or green light. The emitted photons may propagate in many different directions, and may be reflected by the mesa reflector and/or the back reflector and may exit LED 705, for example, from the bottom side (e.g., substrate 715) shown in FIG. 7B. One or more other secondary optical components, such as a lens or a grating, may be formed on the light emission surface, such as substrate 715, to focus or collimate the emitted light and/or couple the emitted light into a waveguide.

As described above, in semiconductor LEDs, photons are usually generated at a certain internal quantum efficiency through the recombination of electrons and holes within an active region, where the internal quantum efficiency is the proportion of the radiative electron-hole recombination in the active region that emits photons. The generated light may be extracted from the LEDs in a particular direction or within a particular solid angle. The ratio between the number of emitted photons extracted from an LED and the number of electrons passing through the LED is referred to as the external quantum efficiency, which describes how efficiently the LED converts injected electrons to photons that are extracted from the device. The external quantum efficiency may be proportional to the injection efficiency, the internal quantum efficiency, and the extraction efficiency. The injection efficiency refers to the proportion of electrons passing through the device that are injected into the active region. The extraction efficiency is the proportion of photons generated in the active region that escape from the device. For LEDs, and in particular, micro-LEDs including small semiconductor mesa structures formed in epitaxial layers to singulate the micro-LEDs, improving the internal and external quantum efficiency and/or controlling the emission spectrum may be challenging.

The internal quantum efficiency is the proportion of the radiative electron-hole recombination in the active region that emits photons. The internal quantum efficiency of an LED depends on the relative rates of competitive radiative (light producing) recombination and non-radiative (lossy) recombination that occur in the active region of the LED. Non-radiative recombination processes in the active region may include Shockley-Read-Hall (SRH) recombination at defect sites, and eeh/ehh Auger recombination, which is a non-radiative process involving three carriers. The internal quantum efficiency of an LED may be determined by:

$$IQE = \frac{BN^2}{AN + BN^2 + CN^3}, \tag{2}$$

where A, B and C are the rates of SRH recombination, bimolecular (radiative) recombination, and Auger recombination, respectively, and N is the charge-carrier density (i.e., charge-carrier concentration) in the active region.

Figure 8:
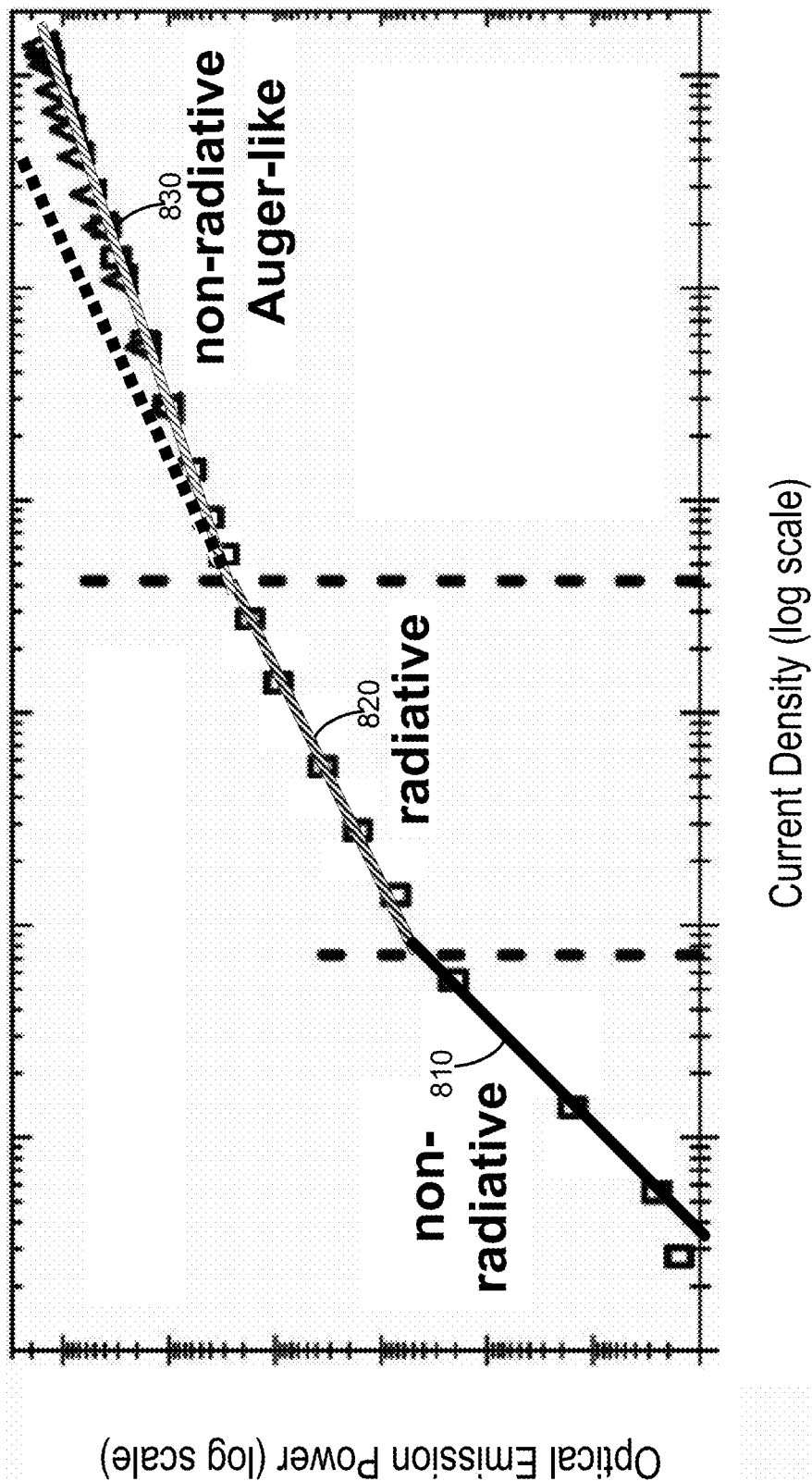
FIG. 8 illustrates the relationship between the optical emission power and the current density of a light emitting diode.

FIG. 8 illustrates the relationship between the optical emission power and the current density of a light emitting diode. As illustrated by a curve 810 in FIG. 8, the optical emission power of a micro-LED device may be low when the current density (and thus the charge carrier density N) is low, where the low external quantum efficiency may be caused by the relatively high non-radiative SRH recombination when the charge carrier density N is low according to equation (2). As the current density (and thus the charge carrier density N) increases, the optical emission power may increase as shown by a curve 820 in FIG. 8, because the radiative recombination may increase at a higher rate ($\propto N^2$) than the non-radiative SRH recombination ($\propto N$) when the charge carrier density N is high according to equation (2). As the current density increases further, the optical emission power may increase at a slower rate as shown by a curve 830 in FIG. 8 and thus the external quantum efficiency may drop as well because, for example, the non-radiative Auger recombination may increase at a higher rate ($\propto N^3$) than the radiative recombination ($\propto N^2$) when the charge carrier density N is sufficiently high according to equation (2).

Auger recombination is a non-radiative process involving three carriers. Auger recombination may be a major cause of efficiency droop and may be direct or indirect. For example, direct Auger recombination occurs when an electron and a hole recombine, but instead of producing light, either an electron is raised higher into the conduction band or a hole is pushed deeper into the valence band. Auger recombination may be reduced to mitigate the efficiency droop by lowering the charge-carrier density N in the active region for a given injection current density J, which may be written as:

$$J = qd_{eff}(AN + BN^2 + CN^3), \tag{3}$$

where $d_{eff}$ is the effective thickness of the active region. Thus, according to equation (3), the effect of the Auger recombination may be reduced and thus the IQE of the LED may be improved by reducing the charge-carrier density N for a given injection current density, which may be achieved by increasing the effective thickness of the active region $d_{eff}$. The effective thickness of the active region may be increased by, for example, growing multiple quantum wells (MQWs). Alternatively, an active region including a single thick double heterostructure (DH) may be used to increase the effective thickness of the active region.

While the Auger recombination due to a high current density (and high charge carrier density) may be an intrinsic process depending on material properties, non-radiative SRH recombination depends on the characteristics and the quality of material, such as the defect density in the active region. As described above, LEDs may be fabricated by etching mesa structures into the active emitting layers to confine carriers within the mesa structures of the individual LEDs and to expose the n-type material beneath the active emitting layers for electrical contact. When mesa structures are etched (e.g., using high-energy ions such as $Ar^+$, $Cl_2^+$, $Cl^+$, or $HF^+$) to isolate individual LEDs, the facets of the mesa structure, such as mesa sidewalls 732, may include some defects, such as lattice dislocations, dangling bonds, pores, grain boundaries, vacancies, surface oxides, surfaces modified by plasma atoms, interstitial defects, substitutional defects, inclusion of precipitates, and the like. The defects may create energy levels that otherwise would not exist within the bandgap of the semiconductor material, causing non-radiative electron-hole recombination at or near the facets of the mesa structure. Thus, these imperfections may become the recombination centers where electrons and holes may be confined until they combine non-radiatively. Therefore, the active region in proximity to the exposed sidewalls may have a higher rate of non-radiative SRH recombination, thereby reducing the efficiency of the LED. Due to the small size of the mesa structure, a larger proportion of the injected carriers may diffuse to regions near the mesa sidewalls and may be subjected to a higher non-radiative recombination rate. This may cause the peak efficiency of the LED to decrease significantly and/or cause the peak efficiency operating current to increase.

Parameters that may affect the impact on the LED efficiency by the non-radiative surface recombination may include, for example, the surface recombination velocity (SRV) S, the carrier diffusion coefficient (diffusivity) D, and the carrier life time τ. The high recombination rate in the vicinity of the sidewall surfaces due to the high defect density may depend on the number of excess carriers (in particular, the minority carriers) in the region. The high recombination rate may deplete the carriers in the region. The depletion of the carriers in the region may cause carriers to diffuse to the region from surrounding regions with higher carrier concentrations. Thus, the amount of surface recombination may be limited by the surface recombination velocity S at which the carriers move to the regions near the sidewall surfaces. The carrier life time τ is the average time that a carrier can spend in an excited state after the electron-hole generation before it recombines with another carrier. The carrier life time τ generally depends on the carrier concentration and the recombination rate in the active region. The carrier diffusion coefficient (diffusivity) D of the material and the carrier life time τ may determine the carrier diffusion length $L=\sqrt{D \times \tau}$, which is the average distance a carrier can travel from the point of generation until it recombines. The carrier diffusion length L characterizes the width of the region that is adjacent to a sidewall surface of the active region and where the contribution of surface recombination to the carrier losses is significant. Charge carriers injected or diffused into the regions that are within a minority carrier diffusion length from the sidewall surfaced may be subject to the higher SRH recombination rate.

For traditional, broad area LEDs used in lighting and backlighting applications (e.g., with a lateral device area about 0.1 mm² to about 1 mm²), the sidewalls are at the far ends of the devices. The devices can be designed such that little or no current is injected into regions within a minority carrier diffusion length from the mesa sidewalls, and thus the sidewall surface area to volume ratio and the overall rate of SRH recombination may be low. However, in micro-LEDs, as the size of the LED is reduced to a value comparable to or having a same order of magnitude as the minority carrier diffusion length, the increased surface area to volume ratio may lead to a high carrier surface recombination rate, because a greater proportion of the total active region may fall within the minority carrier diffusion length from the LED sidewalls. Therefore, more injected carriers may be subjected to the higher SRH recombination rate. This can cause the leakage current of the LED to increase and the efficiency of the LED to decrease as the size of the LED decreases, and/or cause the peak efficiency operating current to increase as the size of the LED decreases. For example, for a first LED with a 100 m×100 m×2 m mesa, the sidewall surface area to volume ratio may be about 0.04. However, for a second LED with a 5 μm×m×2 μm mesa, the side wall surface area to volume ratio may be about 0.8, which is about 20 times higher than the first LED. Thus, with a similar surface defect density, the SRH recombination coefficient of the second LED may be about 20 times higher as well. Therefore, the efficiency of the second LED may be significantly lower than the first LED.

AlGaInP material may have a high surface recombination velocity and minority carrier diffusion length than some other light emission materials, such as III-nitride materials. For example, red AlGaInP LEDs may generally operate at a reduced carrier concentration (e.g., about $10^{17}$ to $10^{18}$ cm$^{-3}$), and thus may have a relatively long carrier life time τ. The carrier diffusivity D in the active region in the undoped quantum wells of red AlGaInP LEDs may also be rather large. As a result, the carrier diffusion length $L=\sqrt{D \times \tau}$ can be, for example, about 10-25 μm or longer in some devices. In addition, the surface recombination velocity of AlGaInP material may be an order of magnitude higher than the surface recombination velocities of III-nitride materials. Thus, compared with LED made of III-nitride materials (e.g., blue and green LEDs made of GaN), the internal and external quantum efficiencies of AlGaInP-based red LEDs can drop even more significantly as the device size decreases.

Figure 9:
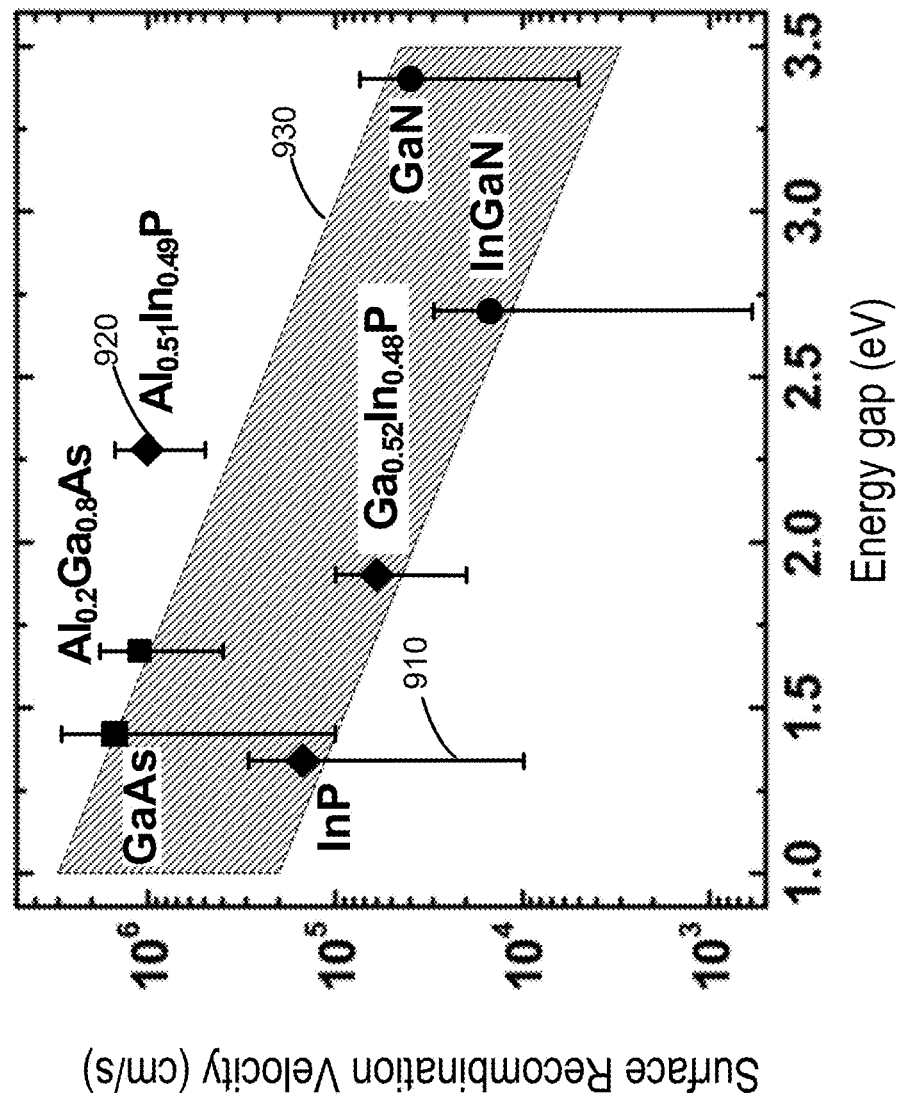
FIG. 9 illustrates surface recombination velocities of various III-V semiconductors.

FIG. 9 illustrates surface recombination velocities of various III-V semiconductor materials. Bars 910 in FIG. 9 show the ranges of reported SRV values of the III-V semiconductor materials, whereas symbols 920 on bars 910 indicate the common or averaged SRVs. A box 930 shows a general trend of the surface recombination velocity variation with the materials bandgap. As illustrated in FIG. 9, the SRV is high in GaAs (S~$10^6$ cm/s) compared to InP (S~$10^5$ cm/s) or GaN (S less than about 0.5×$10^5$ cm/s). The surface recombination velocity of AlGaInP material (e.g., ~$10^6$ cm/s) may be at least an order of magnitude higher than the surface recombination velocity of III-nitride materials (e.g., <$10^5$ cm/s). In addition, in Al-containing alloys, such as AlGaInP, SRVs may scale appreciably with the Al fraction. For example, the SRV may increase from about $10^5$ cm/s for $(Al_{0.1}Ga_{0.9})_{0.5}In_{0.5}P$ to about $10^6$ cm/s for $Al_{0.51}In_{0.49}P$.

In addition, nitride LEDs can operate at non-equilibrium carrier concentrations much higher than phosphide LEDs, which results in considerably shorter carrier lifetime in nitride LEDs. Therefore, the carrier diffusion lengths in the active regions of III-nitride LEDs are considerably shorter than the carrier diffusion lengths in phosphide LEDs. As such, phosphide LEDs, such as AlGaInP-based red micro-LEDs may have both higher SRVs and longer carrier diffusion lengths, and thus may have much higher surface recombination and efficiency reduction, than III-nitride LEDs.

Figure 10B:
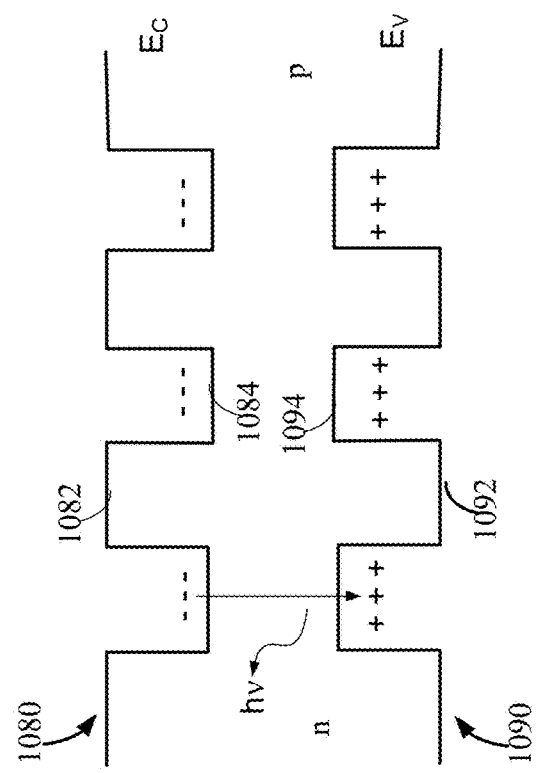
FIG. 10B illustrates a simplified energy band diagram of the active layers of the example of micro-LED shown in FIG. 10A.
Figure 10A:
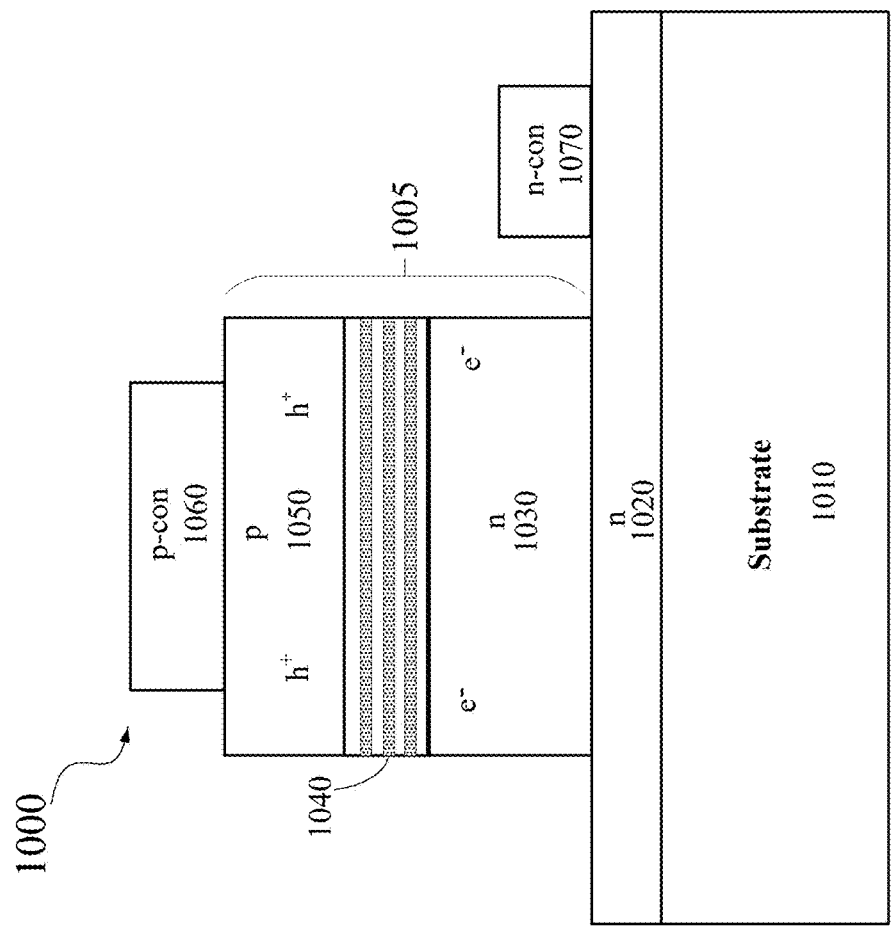
FIG. 10A illustrates an example of a micro-LED having a mesa structure.

FIG. 10A illustrates an example of a micro-LED 1000 having a mesa structure 1005. Micro-LED 1000 may be an example of LED 700 or 705. Micro-LED 1000 may include an n-type semiconductor layer 1020 epitaxially grown on a substrate 1010 that may be similar to substrate 710 or 715. In one example, substrate 1010 may include a GaN substrate or a sapphire substrate with a buffer layer, and n-type semiconductor layer 1020 may include a GaN layer doped with, for example, Si or Ge. In another example, substrate 1010 may include a GaAs substrate. One or more epitaxial layers, such as GaN barrier layers and InGaN quantum well layers, or AlGaInP barrier layers and GaInP quantum well layers, may be grown on n-type semiconductor layer 1020 to form active layers 1040 that includes one or more quantum wells. A p-type semiconductor layer 1050 may be grown on active layers 1040. P-type semiconductor layer 1050 may be doped with, for example, Mg, Ca, Zn, or Be. The layer stack may then be etched to form individual mesa structures 1005 that each include a p-type semiconductor region, an active region that includes active layers 1040, and a region 1030 of n-type semiconductor layer 1020. Mesa structure 1005 may have a lateral linear dimension less than about 100 μm, less than about 50 μm, less than about 20 μm, less than about 10 μm, less than about 5 μm, less than about 3 μm, less than about 2 μm, or smaller. P-contacts 1060 and n-contacts 1070 may be formed on p-type semiconductor layer 1050 and the exposed n regions of n-type semiconductor layer 1020, respectively. Each p-contact 1060 may include, for example, a metal layer (e.g., Al, Au, Ni, Ti, Ag, or any combination thereof), or an indium tin oxide (ITO) and/or Al/Ni/Au film. In some embodiments, p-contact 1060 may form a metal reflector (e.g., Ag) to reflect emitted light towards n-type semiconductor layer 1020. Each n-contact 1070 may also include a layer of a metal material, such as Al, Au, Ni, Ti, or any combination thereof.

Even though not shown in FIG. 10A, a passivation layer, such as an oxide layer (e.g., a SiO$_2$ layer) or another dielectric layer, may be formed on sidewalls of mesa structure 1005. The passivation layer may have a lower refractive index than the active region and may function as a reflector (e.g., due to total internal reflection) to reflect certain emitted light out of micro-LED 1000 as described above. As described above, in some embodiments, a metal layer may be formed on the passivation layer to form a sidewall metal reflector. Even though FIG. 10A shows a vertical mesa structure, micro-LED 1000 may have a different mesa shape, such as a conical, parabolic, inward-tilted, or outward-tilted mesa shape. A dielectric material (e.g., $SiO_2$) may be deposited to fill gaps between micro-LED 1000 and adjacent micro-LEDs.

When a voltage or current signal is applied to p-contact 1060 and n-contact 1070, holes and electrons may be injected into active layers 1040 from p-type semiconductor layer 1050 and region 1030 of n-type semiconductor layer 1020, respectively. The electrons and holes may recombine in the quantum wells of active layers 1040, where the recombination of electrons and holes may cause photon emission. The emitted photons may be reflected by the passivation layer and/or the metal reflector, and may exit micro-LED 1000 from the bottom (e.g., n-type semiconductor layer 1020 side) or the top (e.g., p-contact 1060 side). At the sidewalls of the mesa structure, active layers 1040 may have a higher density of defects, such as dislocations, dangling bonds, pores, grain boundaries, vacancies, inclusion of precipitates, and the like, due to the abrupt ending of the lattice structure and the etching. As such, surface states having energy levels within the bandgap of the bulk semiconductor may be present at the sidewall regions. Holes and electrons injected into the quantum wells of active layers 1040 may diffuse to the sidewall regions, and may recombine via the surface states without generating photons. As such, there may be a high carrier leakage at the mesa side wall, and the internal/external quantum efficiency of micro-LED 1000 may be low, at least due to the losses caused by the non-radiative surface recombination.

FIG. 10B illustrates a simplified energy band diagram of active layers in the active region of the example of micro-LED 1000 shown in FIG. 10A. A curve 1080 in FIG. 10B shows the conduction band of the active region and a curve 1090 shows the valence band of the active region. The active region of micro-LED 1000 may include multiple quantum well layers each sandwiched by two barrier layers. In the example shown in FIG. 10B, the conduction band and the valence band of a barrier layer are shown by a level 1082 and a level 1092, respectively, and the conduction band and the valence band of a quantum well layer are shown by a level 1084 and a level 1094, respectively. As illustrated, the quantum well layer may have a lower energy level and a narrower bandgap between the conduction band and the valence band than the barrier layer. Carriers (electrons and holes) injected into the active region may be confined by the energy barriers to the quantum well layers, where the electrons and holes may recombine to emit light. The wavelength of the emitted light may depend on the bandgap of the light emitting layers (e.g., the quantum well layers). For example, in an InGaN LED, the energy bandgap of the barrier layers (e.g., GaN layer) may be higher than the energy bandgap of the quantum well layers (e.g., InGaN layers), which may decrease (and thus the wavelength of the emitted light may increase) as the proportion of Indium in InGaN increases. In an AlGaInP LED, the energy bandgap of the quantum well layers may be engineered (e.g., by tuning the composition) to emit red light.

According to certain embodiments, to avoid the non-radiative recombination at sidewalls of individual micro-LED mesa structures formed by etching epitaxial layers that include the light-emitting active layers, thereby improving the efficiencies of the micro-LEDs, field-effect isolations formed by electrically depleting at least one type of carriers (e.g., holes) in regions of the active layers surrounding a light-emitting region of each micro-LED may be used to isolate the active layers into individual micro-LEDs during operations of a micro-LED device. Since the active layers are electrically isolated during operations, rather than being physically and/or chemically etched, to form individual micro-LEDs, there would not be high-defect-density sidewall regions in the active layers of the individual micro-LEDs. As such, non-radiative recombination in the active layers can be reduced and the quantum efficiencies of the micro-LEDs can be improved significantly, in particular, for micro-LEDs with small pitches and small active regions.

In one example, the field-effect isolations may be formed by applying, through a gate grid and an insulator grid that surround the light-emitting region of each micro-LED, an electric field to a cladding layer (e.g., p-cladding layer) and active layers to deplete holes in the p-cladding layer and accumulate electrons in the active layers under the gate grid. Increasing the electron density by accumulating electrons in the active layers under the gate grid may reduce the minority carrier (e.g., hole) diffusion length (e.g., to sub-micron ranges) and prevent the minority carriers (e.g., holes) injected by an electrode (e.g., anode) of a micro-LED from diffusing to neighboring micro-LEDs. The gate voltage for all micro-LEDs can be at a same voltage level or similar voltage levels, and there may be no or very low gate current due to the insulator grid. As such, the field-effect isolations can be achieved using a gate grid that is biased to a common voltage level, without using a current driver. The gate grid may be a common gate grid (e.g., including electrically and/or physically shorted columns and rows) for all micro-LEDs, or may include individual structures (e.g., rectangular or circular rings) for respective micro-LEDs. The barrier layer under the gate grid may be thin, such that the field-effect isolations may be achieved using a gate voltage that is not too high.

FIGS. 11A-11B illustrate an example of a field-effect micro-LED device 1100 including a gate grid for field-effect isolation of individual micro-LEDs of an array of micro-LEDs according to certain embodiments. Field-effect micro-LED device 1100 may include a plurality of epitaxial layers grown on a substrate (or a buffer layer on the substrate), where the plurality of epitaxial layers may be isolated into individual micro-LEDs when a voltage signal is applied to the gate grid. In one example, field-effect micro-LED device 1100 may be a common-cathode micro-LED device, where electrons may have a common path for the micro-LEDs and holes may be confined within each micro-LED to isolate the micro-LEDs and avoid crosstalk between the micro-LEDs.

In the example shown in FIGS. 11A-11B, the plurality of epitaxial layers may include a first cladding layer 1110 (e.g., an n-cladding layer), a second cladding layer 1150 (e.g., a p-cladding layer), and active layers that include a first semiconductor layer 1120 (e.g., a barrier layer), a quantum well (QW) layer 1130, and a second semiconductor layer 1140 (e.g., a barrier layer). In some embodiments, the active layers between first cladding layer 1110 and second cladding layer 1150 may include one or more quantum well layers and two or more quantum barrier layers (which may be undoped or lightly doped) that form multiple quantum wells or a multi-quantum-well (MQW). Each micro-LED may include, at the center region, an ITO layer 1160 and/or a distributed feedback reflector (DBR) structure with conductive vias formed therein, and a metal layer 1180 on ITO layer 1160. Metal layer 1180 may include a reflective metal and may also function as a back reflector and/or a bonding pad. Metal layer 1180 and ITO layer 1160 may form an electrode (e.g., anode) of the micro-LED. Each micro-LED may also include, at peripheral regions, an insulator layer 1170 (e.g., a dielectric such as an oxide) and a gate grid 1190 on insulator layer 1170. Gate grid 1190 for each micro-LED may have, for example, a shape of a rectangular or circular ring surrounding the center region when viewed in the z direction. In some embodiments, insulator layer 1170 of multiple or all micro-LEDs may be connected together to form an insulator grid. In some embodiments, gate grid 1190 for all micro-LEDs may be electrically and/or physically connected to form a large grid that may be driven by a same gate voltage signal. In one example, gate grid 1190 may include a plurality of rows and a plurality of columns that are connected together to form a grid.

As shown in FIG. 11A, when no voltage signal is applied to gate grid 1190 and a forward bias voltage signal is applied to the anode and cathode of a micro-LED, holes may be injected from metal layer 1180 through ITO layer 1160 into second cladding layer 1150 (e.g., p-cladding layer), second semiconductor layer 1140 (e.g., a barrier layer), and QW layer 1130. The injected holes may laterally diffuse within the second cladding layer 1150, second semiconductor layer 1140, or QW layer 1130. Therefore, the micro-LEDs are not isolated, and driving the anode of one micro-LED may cause the injection of holes and the emission of light in a neighboring micro-LED.

As shown in FIG. 11B, when a voltage signal (e.g., a positive voltage signal) is applied to gate grid 1190, an electric field may be applied across the epitaxial layers. Due to insulator layer 1170, no current may flow from gate grid 1190 into the epitaxial layers. The electric field in second cladding layer 1150 (e.g., p-cladding layer) may drive holes away from the regions under gate grid 1190, thereby depleting holes in regions of second cladding layer 1150 under gate grid 1190. When the voltage signal is sufficiently high, holes in regions of second cladding layer 1150 under gate grid 1190 may be completely depleted (which may be referred to as channel pinching or pinch-off), and holes injected into the center region of a micro-LED through metal layer 1180 and ITO layer 1160 may be prevented from diffusing across the regions under gate grid 1190 in second cladding layer 1150.

When the voltage signal applied to gate grid 1190 is even higher, electrons may accumulate in regions of the active layers under gate grid 1190, such that the electron density may be very high (e.g., $>1.0 \times 10^{19}$ cm$^{-3}$) in regions of the active layers (including QW layer 1130) under gate grid 1190. The high electron density may reduce the lifetime and the diffusion length of holes (the minority carrier) in the active layers (e.g., QW layer 1130) under gate grid 1190, as holes may recombine with electrons (the majority carrier) to emit light once they reach edges of the regions under gate grid 1190. For example, in GaAs, when the electron density is above $1.0 \times 10^{19}$ cm$^{-3}$, the hole diffusion length may be less than about 0.8 μm or shorter. As such, holes may not diffuse across regions of second cladding layer 1150, second semiconductor layer 1140, or QW layer 1130 under gate grid 1190. Therefore, the plurality of epitaxial layers may be isolated into individual micro-LEDs, and holes injected into second cladding layer 1150 from metal layer 1180 and ITO layer 1160 of a micro-LED may be confined to the center region of the micro-LED to radiatively recombine with electrons in the center region of the active layers of the micro-LED as illustrated in FIG. 11B.

The electron density in regions of the active layers under gate grid 1190 may be increased by, for example, increasing the gate voltage level or reducing the thickness of the cladding layer under gate grid 1190 to increase the electric field, or using a large bandgap semiconductor layer as the cladding layer (e.g., p-cladding layer) to form an electron accumulation layer in the active layers. In one example, to increase the electron density in the active layers under gate grid 1190 without increasing the gate voltage level, a large bandgap semiconductor material, such as AlGaInP with high Al content, may be used in the cladding layer.

Figure 12:
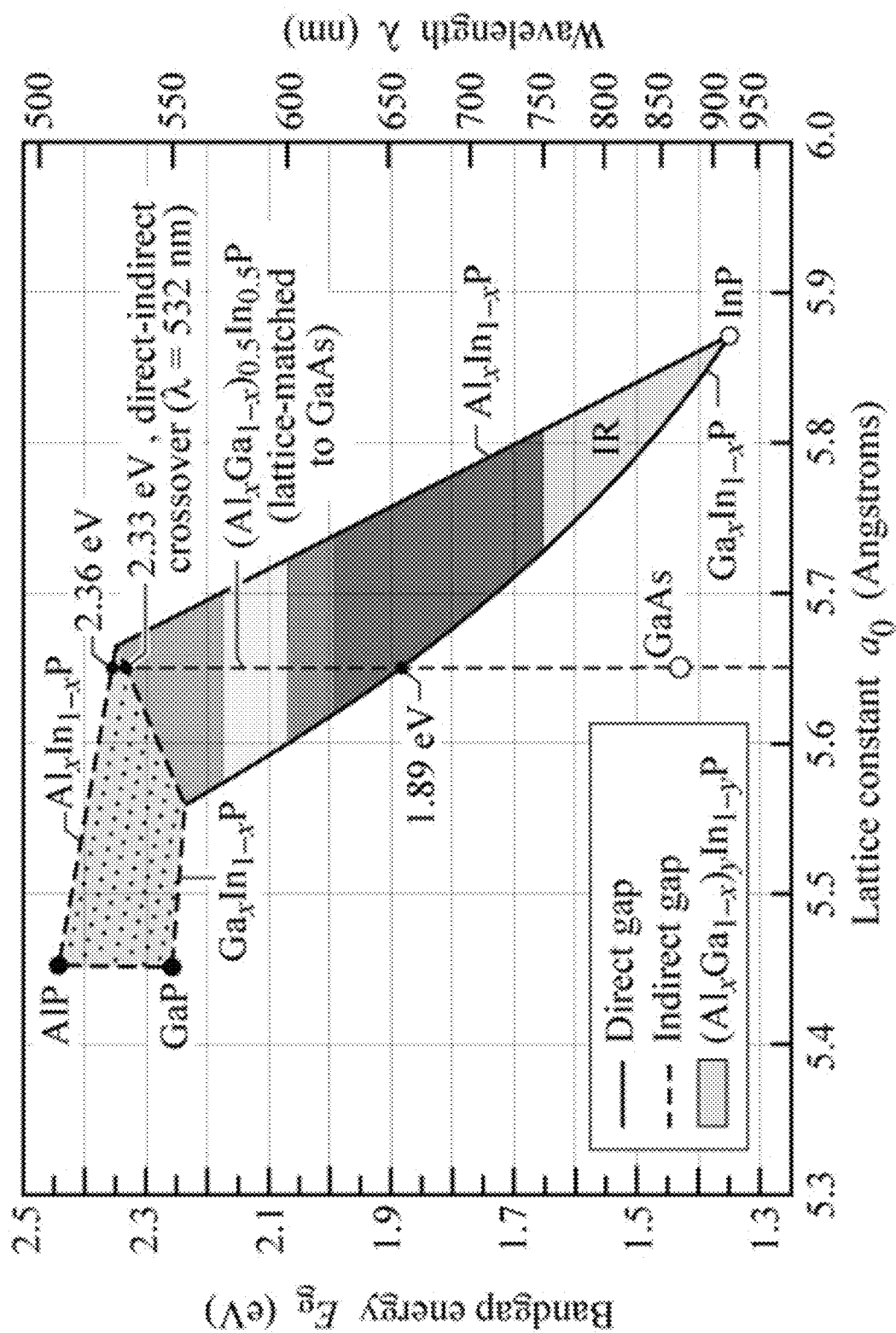
FIG. 12 includes a diagram illustrating lattice constants, bandgaps, and corresponding emission wavelengths of examples of III-phosphide semiconductor materials.

FIG. 12 includes a diagram illustrating lattice constants, bandgaps, and corresponding emission wavelengths of examples of III-phosphide semiconductor materials. As shown in FIG. 12, $(Al_xGa_{1-x})_{0.5}In_{0.5}P$ may have a lattice constant matching the lattice constant of GaAs that may be used as the growth substrate for epitaxially growing III-phosphide semiconductor layers, and $(Al_xGa_{1-x})_{0.5}In_{0.5}P$ may have a larger bandgap (e.g., >2.0 eV) than red light-emitting III-P material. Therefore, $(Al_xGa_{1-x})_{0.5}In_{0.5}P$ cladding layers may be grown on the GaAs substrate to form a heterostructure for accumulating electrons in the active layers.

Figures 13A, 13B:
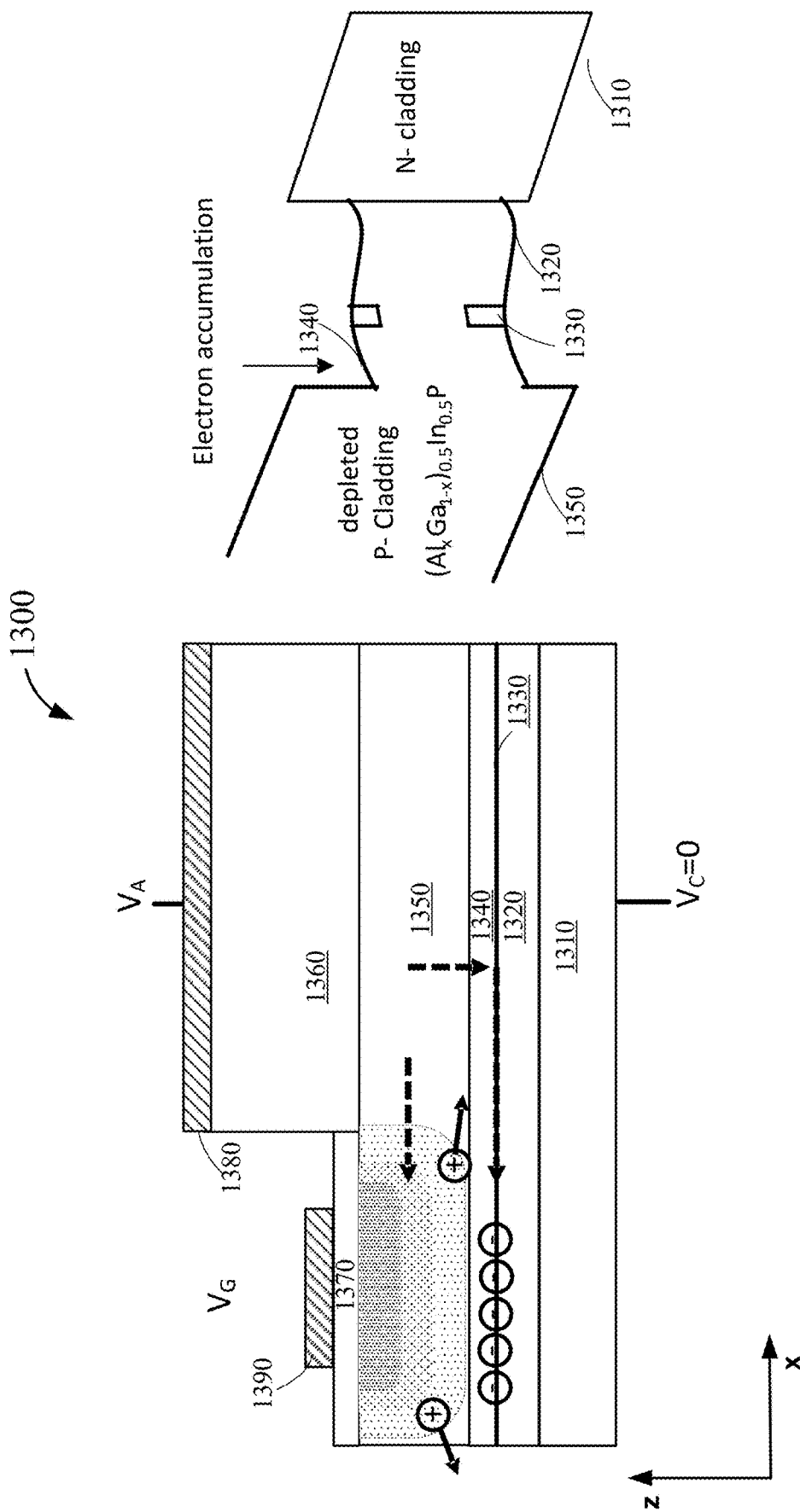
FIG. 13A illustrates an example of a field-effect micro-LED device including depleted p-cladding regions and high-electron-density active layers between individual micro-LEDs when a voltage signal is applied to a gate grid of the field-effect micro-LED device according to certain embodiments.
FIG. 13B shows the energy band diagram of a region of epitaxial layers under the gate grid of the field-effect micro-LED device of FIG. 13A when a voltage signal is applied to the gate grid according to certain embodiments.

FIG. 13A illustrates an example of a field-effect micro-LED device 1300 including depleted p-cladding regions and high-electron-density active layers between individual micro-LEDs when a voltage signal is applied to the gate grid of field-effect micro-LED device 1300 according to certain embodiments. Field-effect micro-LED device 1300 may be an example of field-effect micro-LED device 1100. In the example illustrated in FIG. 13A, field-effect micro-LED device 1300 may include, for each micro-LED of a two-dimensional array of micro-LEDs, an n-cladding layer 1310 (e.g., including n-doped $(Al_xGa_{1-x})_{0.5}In_{0.5}P$ with high Al content), a p-cladding layer 1350 (e.g., including p-doped $(Al_xGa_{1-x})_{0.5}In_{0.5}P$ with high Al content), and active layers between n-cladding layer 1310 and p-cladding layer 1350. The active layers may include a first barrier layer 1320 (e.g., a III-P semiconductor layer), a QW layer 1330 (e.g., a III-P semiconductor layer configured to emit visible light such as red light), and a second barrier layer 1340. In some embodiments, the active layers between n-cladding layer 1310 and p-cladding layer 1350 may include one or more quantum well layers and two or more quantum barrier layers, which may be undoped or lightly doped. Each micro-LED may include, at the center region, an ITO layer 1360 and/or a distributed feedback reflector (DBR) structure with conductive vias formed therein, and metal layer 1380 (which may also function as a back reflector and/or a bonding pad) on ITO layer 1360. Metal layer 1380 and ITO layer 1360 may form an electrode (e.g., anode) of the micro-LED. Each micro-LED may also include, at the peripheral regions, an insulator layer 1370 (e.g., including a dielectric such as an oxide), and a gate grid 1390 on insulator layer 1370. Gate grid 1390 for each micro-LED may have, for example, a shape of a rectangular or circular ring surrounding the center region when viewed in the z direction. In some embodiments, insulator layer 1370 of multiple or all micro-LEDs may be connected together to form an insulator grid. In some embodiments, gate grid 1390 for all micro-LEDs may be electrically and/or physically connected to form a large grid that may be driven by a same gate voltage signal. In one example, gate grid 1390 may include a plurality of rows and a plurality of columns that are connected together to form a grid.

As shown in FIG. 13A, when a voltage signal $V_G$ (e.g., a positive voltage signal) is applied to gate grid 1390 and the common cathode of field-effect micro-LED device 1300 is connected to ground ($V_C=0$), an electric field may be applied across the epitaxial layers between insulator layer 1370 and n-cladding layer 1310. The electric field in p-cladding layer 1350 may drive holes aways from the regions under gate grid 1390, thereby depleting holes in regions of p-cladding layer 1350 under gate grid 1390. When the voltage signal is sufficiently high, holes in regions of p-cladding layer 1350 under gate grid 1390 may be completely depleted, and holes injected into the center region of a micro-LED through metal layer 1380 and ITO layer 1360 may be prevented from diffusing across the regions under gate grid 1390 in p-cladding layer 1350. Voltage signal $V_G$ may be sufficiently high such that electrons may accumulate in regions of the active layers under gate grid 1390. For example, the electron density may be very high (e.g., >$1.0 \times 10^{19}$ cm$^{-3}$) in regions of p the active layers (including QW layer 1330) under gate grid 1390. The high electron density may reduce the diffusion length of holes (the minority carrier) in the active layers (e.g., QW layer 1330) under gate grid 1390 to, for example, less than about 0.8 µm or shorter, as holes may recombine with electrons (the majority carrier) to emit light once they reach edges of the regions under gate grid 1390. As such, holes injected into p-cladding layer 1350 from metal layer 1380 when an anode voltage VA is applied to metal layer 1380 may not diffuse across regions of p-cladding layer 1350, second barrier layer 1340, or QW layer 1330 under gate grid 1390. Therefore, the plurality of epitaxial layers may be isolated into individual micro-LEDs, and holes injected into p-cladding layer 1350 of a micro-LED from metal layer 1380 and ITO layer 1360 may be confined to the center region of the micro-LED to radiatively recombine with electrons in the center region of the active layers (e.g., QW layer 1330) of the micro-LED.

FIG. 13B shows the energy band diagram of a region of epitaxial layers under gate grid 1390 in field-effect micro-LED device 1300 when a voltage signal is applied to gate grid 1390 of field-effect micro-LED device 1300 according to certain embodiments. As described above, p-cladding layer 1350 may include, for example, AlGaInP (e.g., $(Al_xGa_{1-x})_{0.5}In_{0.5}P$) with high Al content, which may have a larger bandgap (e.g., >2.0 eV) than red light-emitting III-P semiconductor materials in the active layers of field-effect micro-LED device 1300. N-cladding layer 1310 may also include, for example, AlGaInP (e.g., $(Al_xGa_{1-x})_{0.5}In_{0.5}P$) with high Al content that may have a larger bandgap than red light-emitting III-P semiconductor materials in the active layers. Therefore, the epitaxial layers may include double hetero-structures.

FIG. 13B shows that, when voltage signal $V_G$ (e.g., a positive voltage signal) is applied to gate grid 1390 and the cathode is connected to ground ($V_C$=0), holes in p-cladding layer 1350 may be depleted, and the conduction band of the active layers adjacent to p-cladding layer 1350 may be bent to form a well where electrons may accumulate to increase the electron density. The increase in the electron density in the active layers under gate grid 1390 may reduce the diffusion length of holes in the active layers and prevent holes injected from the anode to diffuse across the regions under gate grid 1390 as described above.

Therefore, the gate voltage for generating the field-effect isolations in the epitaxial layers may be decreased by using higher bandgap cladding layers to increase the electron density in the active layers under the gate grid. In some embodiments, to further reduce the gate voltage for depleting the cladding layer and increasing the electron density in the active layers under the gate grid, the cladding layer under the gate grid may be thinned, such as partially etched using an etch-stop layer (e.g., an AlAs layer) without etching the active layers. In some embodiments, the cladding layer under the gate grid and the insulator grid may be very thin or may be completely removed, and thus the gate voltage for generating the field-effect isolations can be low and can be provided by the forward driving voltage of the micro-LEDs. As such, the gate grid for each micro-LED may be shorted to the anode of the micro-LED, and no additional gate control signal may be needed for generating the field-effect isolations in the epitaxial layers.

Figure 14B:
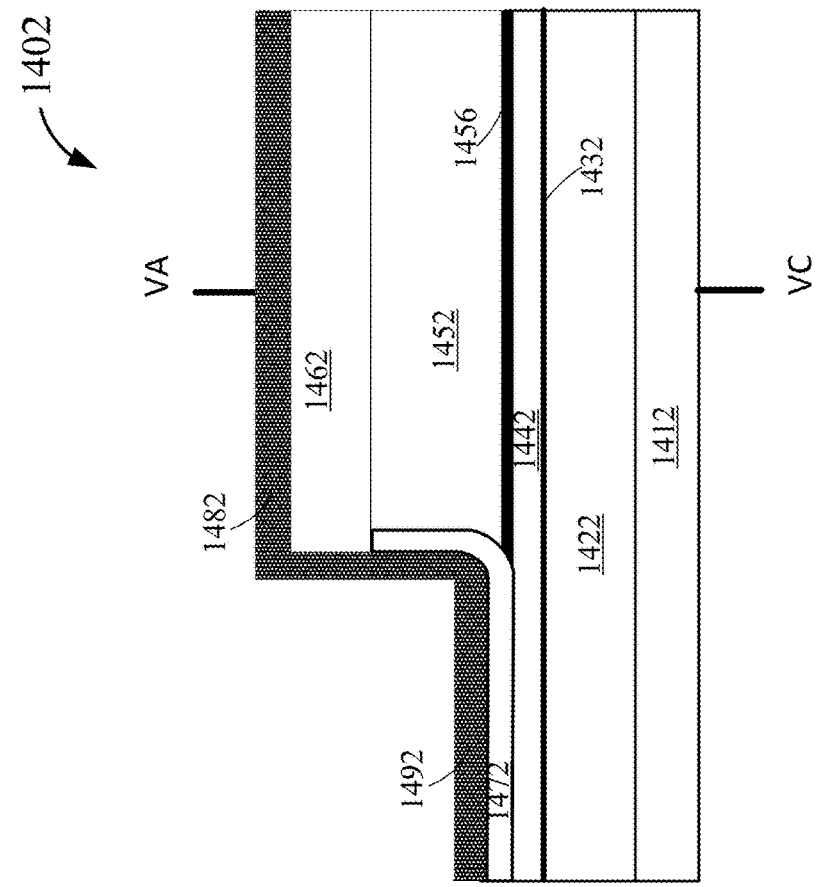
FIG. 14B illustrates another example of a field-effect micro-LED device according to certain embodiments.
Figure 14A:
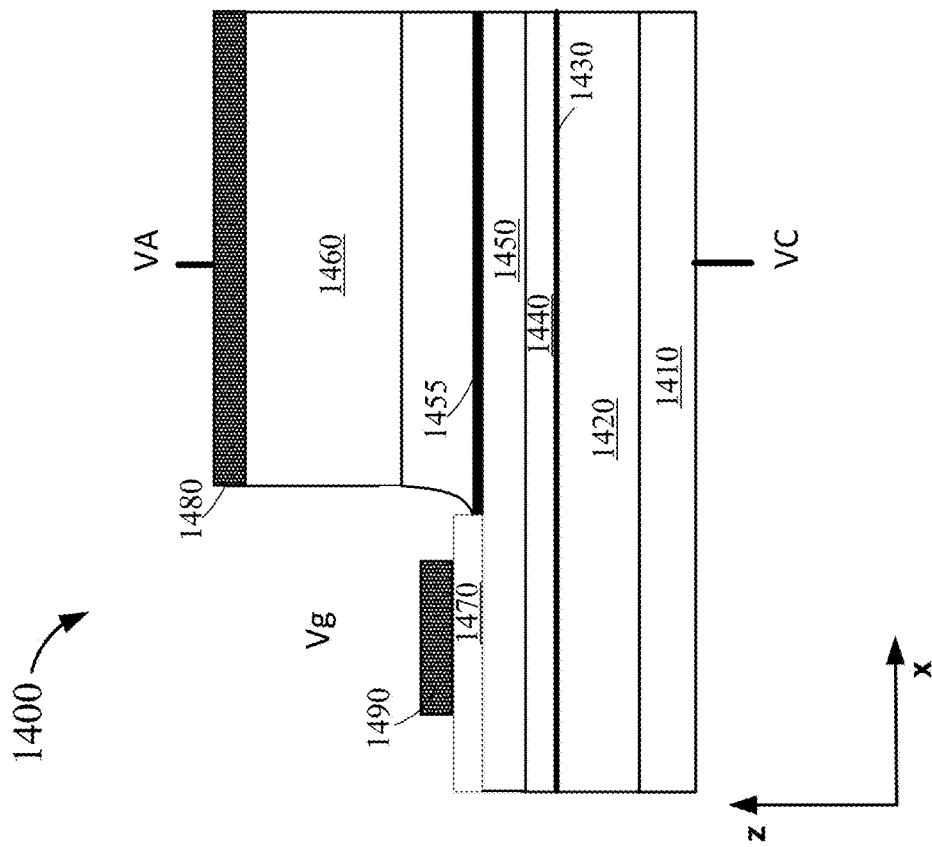
FIG. 14A illustrates an example of a field-effect micro-LED device according to certain embodiments.

FIG. 14A illustrates an example of a field-effect micro-LED device 1400 according to certain embodiments. FIG. 14A shows an example of reducing the gate voltage level for field-effect isolation in a field-effect micro-LED device. Field-effect micro-LED device 1400 may be similar to field-effect micro-LED device 1100 or 1300, but may have a thinner cladding layer under the gate grid than field-effect micro-LED device 1100 or 1300. In the illustrated example, field-effect micro-LED device 1400 may include, for each micro-LED of a two-dimensional array of micro-LEDs, a first cladding layer 1410 (e.g., an n-cladding layer including $(Al_xGa_{1-x})_{0.5}In_{0.5}P$ with high Al content), a second cladding layer 1450 (e.g., a p-cladding layer including $(Al_xGa_{1-x})_{0.5}In_{0.5}P$ with high Al content), and active layers between first cladding layer 1410 and second cladding layer 1450. The active layers may include, for example, a first barrier layer 1420 (e.g., a III-P semiconductor layer), a QW layer 1430 (e.g., a III-P semiconductor layer configured to emit visible light such as red light), and a second barrier layer 1440. In some embodiments, the active layers between first cladding layer 1410 and second cladding layer 1450 may include one or more quantum well layers and two or more quantum barrier layers, which may be undoped or lightly doped. Each micro-LED may include, at the center region, an ITO layer 1460 and/or a distributed feedback reflector (DBR) structure with one or more conductive vias formed therein, and a metal layer 1480 (which may also function as a back reflector and/or a bonding pad) on ITO layer 1460. Metal layer 1480 and ITO layer 1460 may form a pixel electrode, such as an anode.

Second cladding layer 1450 at the peripheral regions of each micro-LED may be thinned, for example, by dry or wet etching. In the illustrated example, an etch-stop layer 1455 may be grown after growing a first sublayer of second cladding layer 1450. The first sublayer may be thin, such as about a few microns or a few tens of microns. Etch-stop layer 1455 may be a thin layer that includes, for example, AlAs, and may be used as the etch-stop layer for dry etching. A second sublayer of second cladding layer 1450 may be grown on etch-stop layer 1455. After the epitaxial growth and the deposition of ITO layer 1460, peripheral regions of each micro-LED may be etched using etch-stop layer 1455 to remove ITO layer 1460 and the second sublayer of second cladding layer 1450 at the peripheral regions. The exposed etch-stop layer 1455 after the etching may be removed by, for example, oxidization and wet etching, to expose the first sublayer of second cladding layer 1450. An insulator layer 1470 (e.g., including a dielectric material such as oxide) may be deposited on the exposed first sublayer of second cladding layer 1450, and gate grid 1490 may be formed on insulator layer 1470. Gate grid 1490 for each micro-LED may have, for example, a shape of a rectangular or circular ring surrounding the center region when viewed in the z direction. In some embodiments, insulator layer 1470 of multiple or all micro-LEDs may be connected together to form an insulator grid. In some embodiments, gate grid 1490 for all micro-LEDs may be electrically and/or physically connected to form a large grid that may be driven by a same gate voltage signal. In one example, gate grid 1490 may include a plurality of rows and a plurality of columns that are connected together to form a grid.

As shown in FIG. 14A, insulator layer 1470 and gate grid 1490 may be formed in recessed peripheral regions of the micro-LEDs, and second cladding layer 1450 under gate grid 1490 may be thin. Therefore, a lower gate voltage can be used to deplete the remaining second cladding layer (e.g., the first sublayer) and cause electron accumulation under gate grid 1490. Since second cladding layer 1450 is not completely removed, there may be no damages to the active layers under gate grid 1490 that may otherwise cause non-radiative recombination and efficiency drop.

FIG. 14B illustrates another example of a field-effect micro-LED device 1402 according to certain embodiments. In the illustrated example, field-effect micro-LED device 1402 may include, for each micro-LED of a two-dimensional array of micro-LEDs, a first cladding layer 1412, a second cladding layer 1452, and active layers between first cladding layer 1412 and second cladding layer 1452. The active layers may include a first barrier layer 1422 (e.g., a III-P semiconductor layer), a QW layer 1432 (e.g., a III-P semiconductor layer configured to emit visible light), and a second barrier layer 1442. In some embodiments, the active layers between first cladding layer 1412 and second cladding layer 1452 may include one or more quantum well layers and two or more quantum barrier layers, which may be undoped or lightly doped. Each micro-LED may include, at the center region, an ITO layer 1462 and/or a distributed feedback reflector (DBR) structure with one or more conductive vias formed therein.

Second cladding layer 1452 at the peripheral regions of each micro-LED may be removed, for example, by etching. In the illustrated example, an etch-stop layer 1456 may be grown before growing second cladding layer 1452. Etch-stop layer 1456 may be a thin layer that includes, for example, AlAs, and may be used as the etch-stop layer for dry etching. After the epitaxial growth and the deposition of ITO layer 1462, peripheral regions of each micro-LED may be etched using etch-stop layer 1456 to remove ITO layer 1462 and second cladding layer 1452 at the peripheral regions, and expose etch-stop layer 1456. The exposed etch-stop layer 1456 may be removed by, for example, oxidization and wet etching, to expose the active layers. An insulator layer 1472 (e.g., including a dielectric material such as oxide) may be deposited on the exposed active layers, sidewalls of second cladding layer 1452 and/or ITO layer 1462, and/or peripheral regions of the top surface of ITO layer 1462. A metal layer 1482 may then be deposited on insulator layer 1472 and the sidewalls and top surface of ITO layer 1462. Metal layer 1482 may be used as both the anode for each micro-LED and a field plate (or gate) for applying an electric field in the active layers at the peripheral regions of each micro-LED to cause electron accumulation in active layers between micro-LEDs and reduce hole diffusion length. Metal layer 1482 may also be used as the back reflector or bonding pad for the micro-LEDs.

Applying an anode voltage VA to metal layer 1482 may inject holes into second cladding layer 1452 and the active layers, and may also apply, through a recessed portion 1492 of metal layer 1482, an electric field to the active layers in the peripheral regions of each micro-LED to cause electron accumulation in the active layers in the peripheral regions of the micro-LED, thereby reducing the hole diffusion length. Since there may not be any second cladding later under the recessed portion 1492 of metal layer 1482, the voltage level for accumulating electrons to prevent holes from diffusing across the peripheral regions of the micro-LED may be low and may be comparable to the anode voltage level of the micro-LED, no additional gate grid and high-voltage control signals may be needed to apply high voltage levels at peripheral regions of the micro-LEDs to electrically isolate individual micro-LEDs.

FIGS. 15A-15B illustrate an example of a process of fabricating a field-effect micro-LED device 1500 according to certain embodiments. Field-effect micro-LED device 1500 may be an example of field-effect micro-LED device 1400 described above. As illustrated in FIG. 15A, a first cladding layer 1510 (e.g., an n-doped AlGaInP layer) may be grown on a growth substate (e.g., a GaAs substrate). Active layers may then be grown on first cladding layer 1510. The active layers may include a first barrier layer 1520, a quantum well layer 1530, and a second barrier layer 1540. In some embodiments, the active layers may include one or more quantum well layers and two or more quantum barrier layers that form one or more quantum wells. A first sublayer 1550 of a second cladding layer (e.g., p-doped AlGaInP layer) may be grown on the active layers. An etch-stop layer 1552 may be grown on first sublayer 1550 of the second cladding layer. Etch-stop layer 1552 may include, for example, AlAs. A second sublayer 1554 of the second cladding layer may be grown on etch-stop layer 1552. An ITO layer 1560 (or DBR layers) may be formed on second sublayer 1554 of the second cladding layer.

An etch mask may then be formed on ITO layer 1560 and used to dry etch ITO layer 1560 and second sublayer 1554 of the second cladding layer to define the regions for individual micro-LEDs, where ITO layer 1560 and second sublayer 1554 of the second cladding layer in the center region of each micro-LED region may not be etched, while ITO layer 1560 and second sublayer 1554 of the second cladding layer in the peripheral regions of each micro-LED region may be etched to expose etch-stop layer 1552. The exposed etch-stop layer 1552 may be removed by, for example, oxidization and wet etching, to expose first sublayer 1550 of the second cladding layer at the peripheral regions of each micro-LED region as shown in FIG. 15A.

FIG. 15B shows that an insulator layer 1570 (e.g., including a dielectric material such as oxide) may be deposited on the exposed second sublayer 1554 of the second cladding layer, sidewalls of second sublayer 1554 and ITO layer 1560, and peripheral regions of the top surface of ITO layer 1560. A metal layer 1580 may then be deposited on insulator layer 1472 and top surface of ITO layer 1560. In some embodiments, an ITO layer (not shown in FIG. 15B) may be deposited on insulator layer 1570 that is deposited on the exposed second sublayer 1554 of the second cladding layer, before depositing metal layer 1580. Metal layer 1580 may be patterned to form electrodes (e.g., anodes) for individual micro-LEDs and a gate grid 1590 for field-effect micro-LED device 1500. Metal layer 1580 and ITO layer 1560 may be used as the anode to inject carriers (e.g., holes) into the active layers of the micro-LED to emit light. Metal layer 1580 may also be used as the back reflector, and/or bonding pad for each micro-LED. During operations of field-effect micro-LED device 1500, a gate voltage (e.g., a DC bias voltage) may be applied to gate grid 1590 to deplete holes in first sublayer 1550 of the second cladding layer and to accumulate electrons in the active layers under gate grid 1590, thereby reducing holes diffusion length, preventing holes diffusion to neighboring micro-LEDs, and electrically isolating individual micro-LEDs.

Figure 16B:
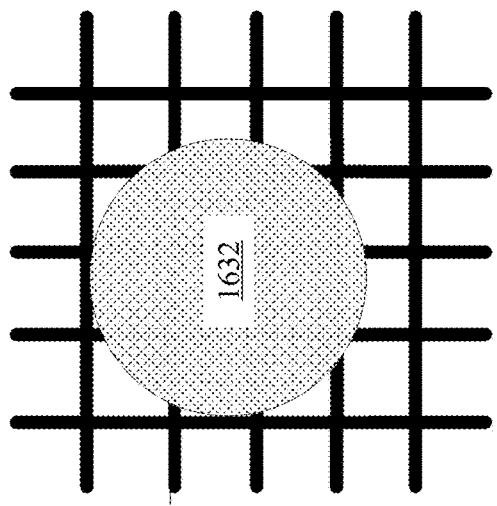
FIG. 16B illustrates an example of a hole transport region in a quantum well layer of the field-effect micro-LED device of FIG. 16A with no voltage level applied to the gate grid according to certain embodiments.
Figure 16C:
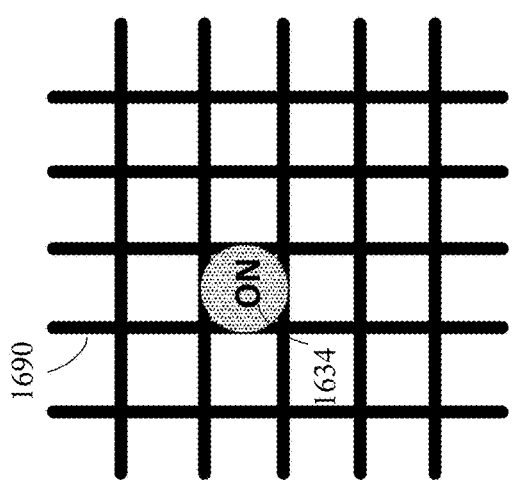
FIG. 16C illustrates an example of a hole transport region in the quantum well layer of the field-effect micro-LED device of FIG. 16A with a gate voltage applied to the gate grid according to certain embodiments.
Figure 16A:
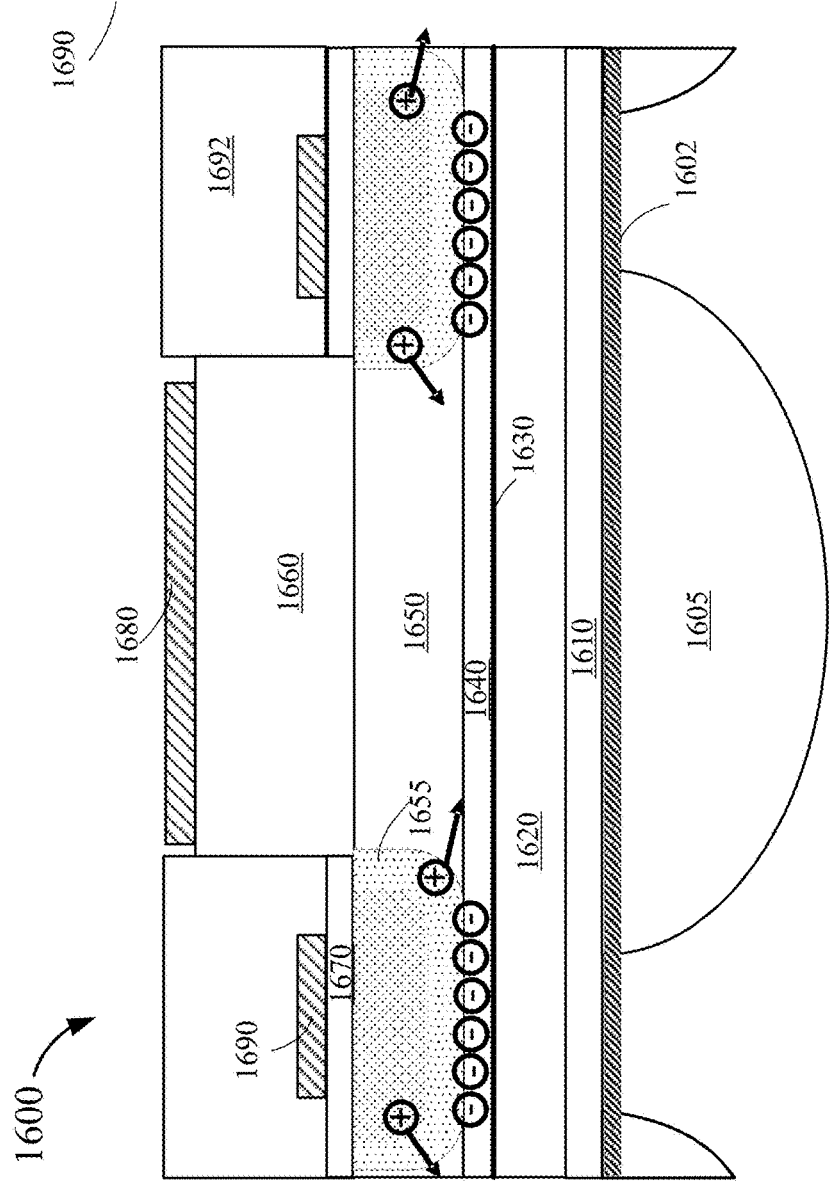
FIG. 16A illustrates an example of a field-effect micro-LED device according to certain embodiments.

FIG. 16A illustrates an example of a field-effect micro-LED device 1600 according to certain embodiments. Field-effect micro-LED device 1600 may be similar to field-effect micro-LED device 1100, 1300, 1400, or 1500 described above. In the example illustrated in FIG. 16A, field-effect micro-LED device 1600 may include, for each micro-LED of a two-dimensional array of micro-LEDs, an n-cladding layer 1610 (e.g., including $(Al_xGa_{1-x})_{0.5}In_{0.5}P$ with high Al content), a p-cladding layer 1650 (e.g., including $(Al_xGa_{1-x})_{0.5}In_{0.5}P$ with high Al content), and active layers between n-cladding layer 1610 and p-cladding layer 1650. The active layers may include, for example, a first barrier layer 1620 (e.g., a III-P semiconductor layer), a QW layer 1630 (e.g., a III-P semiconductor layer configured to emit red light), and a second barrier layer 1640. In some embodiments, the active layers between n-cladding layer 1610 and p-cladding layer 1650 may include one or more quantum well layers and two or more quantum barrier layers, which may be undoped or lightly doped. Each micro-LED may include, at the center region, an ITO layer 1660 and/or a distributed feedback reflector (DBR) structure with one or more conductive vias formed therein, and a metal layer 1680 (which may also function as a back reflector and/or a bonding pad) on ITO layer 1660. Metal layer 1680 and on ITO layer 1660 may form an electrode (e.g., an anode) for the micro-LED. Each micro-LED may also include, at the peripheral regions, an insulator layer 1670 (e.g., including a dielectric such as an oxide), and a gate grid 1690 on insulator layer 1670. In some embodiments, insulator layer 1670 of multiple or all micro-LEDs may be connected together to form an insulator grid. Gate grid 1690 for each micro-LED may have, for example, a shape of a rectangular or circular ring surrounding the center region when viewed in the z direction. Gate grid 1690 for all micro-LEDs may be electrically connected to form a large grid that may be controlled by a same gate voltage signal. Since there may be no or only a minimum gate current at gate grid 1690 due to insulator layer 1670, a driver may not be needed for gate grid 1690. For example, gate grid 1690 may include a plurality of rows and a plurality of columns that are connected together to form a grid. A dielectric material 1692 may be deposited on gate grid 1690. Dielectric material 1692 and metal pads 1680 may be planarized and bonded to a backplane (e.g., a CMOS wafer) that includes drive circuits formed thereon.

After bonding the micro-LED wafer to the backplane, substrate of the micro-LED wafer may be removed, and micro-lenses 1605 or other light extraction structures may be etched in the exposed semiconductor layer. In some embodiments, an etch-stop layer 1602 (e.g., an AlAs layer) may be grown on the substate before growing n-cladding layer 1610. The process of etching micro-lenses 1605 may stop at etch-stop layer 1602 to avoid etching the active layers. The total thickness of n-cladding layer 1610, the active layers, and p-cladding layer 1650 may be low (e.g., about or less than a wavelength) such that light emitted in the active layers of one micro-LED may not be guided by n-cladding layer 1610, the active layers, and p-cladding layer 1650 to another micro-LED.

FIG. 16B illustrates an example of a hole transport region 1632 in quantum well layer 1630 of field-effect micro-LED device 1600 with no voltage level applied to gate grid 1690 according to certain embodiments. When no voltage level is applied to gate grid 1690, carriers (e.g., holes) injected into the active layers (e.g., quantum well layer 1630) of a micro-LED from the anode of the micro-LED may diffuse within quantum well layer 1630, and the minority carrier diffusion length may be long. Therefore, hole transport region 1632 for holes injected from an anode of a micro-LED may be large in QW layer 1630, and thus minority carriers (e.g., holes) injected from an anode of a micro-LED may diffuse to the active layers of adjacent micro-LEDs. As such, the micro-LEDs may not be electrically isolated.

FIG. 16C illustrates an example of a hole transport region 1634 in quantum well layer 1630 of field-effect micro-LED device 1600 with a gate voltage applied to gate grid 1690 according to certain embodiments. As shown in FIGS. 16A and 16C, when a voltage signal (e.g., a positive voltage signal) is applied to gate grid 1690, an electric field may be applied across the epitaxial layers between insulator layer 1670 and n-cladding layer 1610. The electric field in p-cladding layer 1650 may drive holes aways from regions 1655 of p-cladding layer 1650 under gate grid 1690, thereby deplete holes in regions 1655 of p-cladding layer 1650 under gate grid 1690. When the voltage signal is sufficiently high, holes in regions 1655 of p-cladding layer 1650 under gate grid 1690 may be completely depleted, and holes injected into the center region of a micro-LED through metal layer 1680 and ITO layer 1660 may be prevented from diffusing across regions 1655 under gate grid 1690 in p-cladding layer 1650. When the voltage signal is sufficiently high, electrons may accumulate in regions of the active layers under gate grid 1690. For example, the electron density may be very high (e.g., $>1.0 \times 10^{19}$ cm$^{-3}$) in regions of the active layers (including QW layer 1630). The high electron density may reduce the diffusion length of holes (the minority carrier) in the active layers (e.g., QW layer 1630) under gate grid 1690, as holes may recombine with electrons (the majority carrier) to emit light once they reach edges of the regions under gate grid 1690. For example, in GaAs, when the electron density is above $1.0 \times 10^{19}$ cm$^{-3}$, the hole diffusion length may be less than about 0.8 μm. As such, when an anode voltage VA is applied to metal layer 1680 of a micro-LED, holes injected into p-cladding layer 1650 from metal layer 1680 of the micro-LED may not diffuse across regions of p-cladding layer 1650, second barrier layer 1640, or QW layer 1630 under gate grid 1690. Therefore, individual micro-LEDs may be isolated, and holes injected into p-cladding layer 1650 from metal layer 1680 and ITO layer 1660 of a micro-LED may be confined to hole transport region 1634 (the center region) of the micro-LED to radiatively recombine with electrons in the center region of the active layers of the micro-LED.

Figure 17:
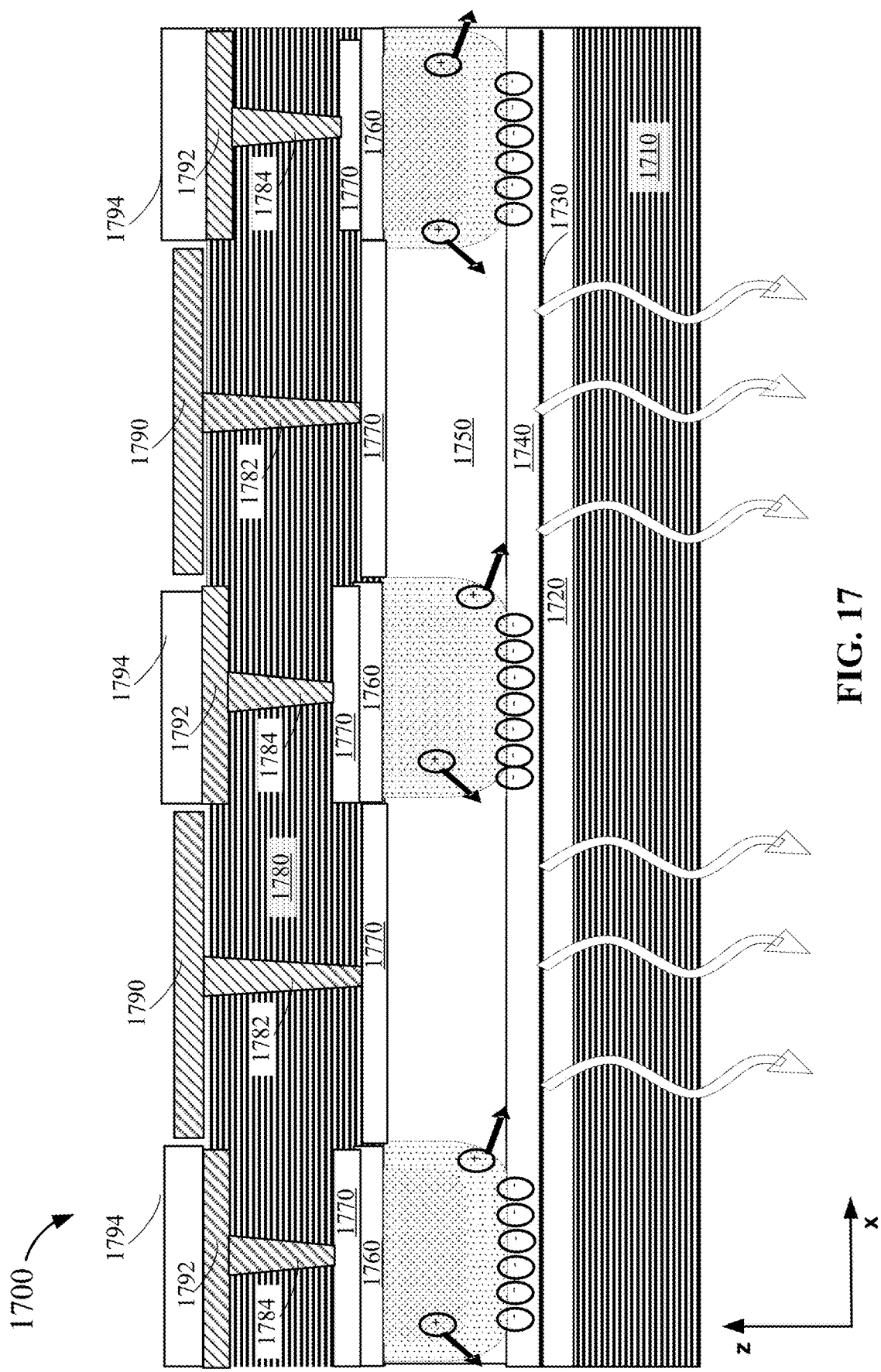
FIG. 17 illustrates an example of a field-effect resonant cavity LED (RC-LED) device according to certain embodiments.

FIG. 17 illustrates an example of a field-effect resonant cavity LED (RC-LED) device 1700 according to certain embodiments. In the illustrated example, field-effect RC-LED device 1700 may include a first DBR structure 1710 formed by, for example, n-doped semiconductor layers of different refractive indices. Active layers that include a first barrier layer 1720, a quantum well layer 1730, and a second barrier layer 1740 may be grown on first DBR structure 1710. A cladding layer 1750 (e.g., including a p-doped semiconductor layer) may be grown on the active layers. An insulator layer (e.g., including a dielectric material such as an oxide) may be deposited on cladding layer 1750, and may be patterned to form an insulator grid 1760. An ITO layer 1770 may be deposited on cladding layer 1750 and insulator grid 1760. A second DBR structure 1780 may be formed on ITO layer 1770. Second DBR structure 1780 may include dielectric materials of different refractive indices and may have a very high reflectivity. Trenches may be formed in second DBR structure 1780 and may be filled with conductive materials such as a metal to form through-vias 1782 and through-vias 1784 in second DBR structure 1780. Through-vias 1784 may be above insulator grid 1760 and may be connected to ITO layer 1770, but may not conduct electrical current because of the underlying insulator grid 1760. Through-vias 1782 may be formed in regions between insulator grid 1760 and through-vias 1784. Metal pads 1790 may be formed on second DBR structure 1780 and electrically coupled to through-vias 1782. Metal pads 1790, through-vias 1782, and ITO layer 1770 may form electrodes (e.g., anodes) for applying voltage signals to individual micro-LEDs based on desired intensities of individual micro-LEDs. Metal pads 1790 may also be used as bonding pads. Metal pads 1792 may also be formed on second DBR structures 1780 and may be electrically coupled to through-vias 1784 formed above insulator grid 1760. Metal pads 1792, through-vias 1784, and ITO layer 1770 may form a gate grid that may be used to apply a voltage signal to cause field-effect isolations between micro-LEDs as described above. A dielectric layer 1794 may be deposited on metal pads 1792. Dielectric layer 1794 and metal pads 1790 may be planarized and bonded to a backplane that includes drive circuits formed thereon.

When a bias voltage signal having a DC voltage level is applied to the gate grid, cladding layer 1750 under the gate grid and insulator grid 1760 may be depleted and electrons may be accumulated in the active layers under insulator grid 1760, thereby depleting holes in regions of cladding layer 1750 and the active layers under insulator grid 1760, such that holes may not diffuse across the regions of cladding layer 1750 and the active layers under insulator grid 1760. In this way, holes injected into a micro-LED through an anode (e.g., metal pad 1790) may be confined in the center region of the micro-LED to radiatively recombine with electrons in quantum well layer 1730 to emit light. The emitted light may be reflected by first DBR structure 1710 and second DBR structure 1780. Second DBR structure 1780 may have a very high reflectivity (e.g., close to 100%) so as to reflect incident light back toward the light-emitting surface of the micro-LED. First DBR structure 1710 may have a lower reflectivity and may allow some light emitted in the active layers to pass through and exit field-effect RC-LED device 1700. Therefore, first DBR structure 1710 and second DBR structure 1780 may form a resonant cavity, where light extracted from the resonant cavity may have a better collimation and a small emission cone, whereas light trapped in the cavity may eventually be absorbed to generate electron-hole pairs, which may recombine to emit light.

FIG. 18A illustrates an example of a method of die-to-wafer bonding for arrays of LEDs according to certain embodiments. In the example shown in FIG. 18A, an LED array 1801 may include a plurality of LEDs 1807 on a carrier substrate 1805. Carrier substrate 1805 may include various materials, such as GaAs, InP, GaN, AlN, sapphire, SiC, Si, or the like. LEDs 1807 may be fabricated by, for example, growing various epitaxial layers, forming mesa structures, and forming electrical contacts or electrodes, before performing the bonding. The epitaxial layers may include various materials, such as GaN, InGaN, (AlGaIn)P, (AlGaIn)AsP, (AlGaIn)AsN, (Eu:InGa)N, (AlGaIn)N, or the like, and may include an n-type layer, a p-type layer, and an active layer that includes one or more heterostructures, such as one or more quantum wells or MQWs. The electrical contacts may include various conductive materials, such as a metal, a metal alloy, a conductive nitride (e.g., a nitride of a transitional metal), or a transparent conductive coating (e.g., an oxide such as ITO).

A wafer 1803 may include a base layer 1809 having passive or active integrated circuits (e.g., drive circuits 1811) fabricated thereon. Base layer 1809 may include, for example, a silicon wafer. Drive circuits 1811 may be used to control the operations of LEDs 1807. For example, the drive circuit for each LED 1807 may include a 2T1C pixel structure that has two transistors and one capacitor. Wafer 1803 may also include a bonding layer 1813. Bonding layer 1813 may include various materials, such as a metal, an oxide, a dielectric, CuSn, AuTi, and the like. In some embodiments, a patterned layer 1815 may be formed on a surface of bonding layer 1813, where patterned layer 1815 may include a metallic grid made of a conductive material, such as Cu, Ag, Au, Al, or the like.

LED array 1801 may be bonded to wafer 1803 via bonding layer 1813 or patterned layer 1815. For example, patterned layer 1815 may include metal pads or bumps made of various materials, such as CuSn, AuSn, or nanoporous Au, that may be used to align LEDs 1807 of LED array 1801 with corresponding drive circuits 1811 on wafer 1803. In one example, LED array 1801 may be brought toward wafer 1803 until LEDs 1807 come into contact with respective metal pads or bumps corresponding to drive circuits 1811. Some or all of LEDs 1807 may be aligned with drive circuits 1811, and may then be bonded to wafer 1803 via patterned layer 1815 by various bonding techniques, such as metal-to-metal bonding. After LEDs 1807 have been bonded to wafer 1803, carrier substrate 1805 may be removed from LEDs 1807.

FIG. 18B illustrates an example of a method of wafer-to-wafer bonding for arrays of LEDs according to certain embodiments. As shown in FIG. 18B, a first wafer 1802 may include a substrate 1804, a first semiconductor layer 1806, active layers 1808, and a second semiconductor layer 1810. Substrate 1804 may include various materials, such as GaAs, InP, GaN, AlN, sapphire, SiC, Si, or the like. First semiconductor layer 1806, active layers 1808, and second semiconductor layer 1810 may include various semiconductor materials, such as GaN, InGaN, (AlGaIn)P, (AlGaIn)AsP, (AlGaIn)AsN, (Eu:InGa)N, (AlGaIn)N, or the like. In some embodiments, first semiconductor layer 1806 may be an n-type layer, and second semiconductor layer 1810 may be a p-type layer. For example, first semiconductor layer 1806 may be an n-doped GaN layer (e.g., doped with Si or Ge), and second semiconductor layer 1810 may be a p-doped GaN layer (e.g., doped with Mg, Ca, Zn, or Be). Active layers 1808 may include, for example, one or more GaN layers, one or more InGaN layers, one or more AlInGaP layers, and the like, which may form one or more heterostructures, such as one or more quantum wells or MQWs.

In some embodiments, first wafer 1802 may also include a bonding layer. Bonding layer 1812 may include various materials, such as a metal, an oxide, a dielectric, CuSn, AuTi, or the like. In one example, bonding layer 1812 may include p-contacts and/or n-contacts (not shown). In some embodiments, other layers may also be included on first wafer 1802, such as a buffer layer between substrate 1804 and first semiconductor layer 1806. The buffer layer may include various materials, such as polycrystalline GaN or AlN. In some embodiments, a contact layer may be between second semiconductor layer 1810 and bonding layer 1812. The contact layer may include any suitable material for providing an electrical contact to second semiconductor layer 1810 and/or first semiconductor layer 1806.

First wafer 1802 may be bonded to wafer 1803 that includes drive circuits 1811 and bonding layer 1813 as described above, via bonding layer 1813 and/or bonding layer 1812. Bonding layer 1812 and bonding layer 1813 may be made of the same material or different materials. Bonding layer 1813 and bonding layer 1812 may be substantially flat. First wafer 1802 may be bonded to wafer 1803 by various methods, such as metal-to-metal bonding, eutectic bonding, metal oxide bonding, anodic bonding, thermo-compression bonding, ultraviolet (UV) bonding, and/or fusion bonding.

As shown in FIG. 18B, first wafer 1802 may be bonded to wafer 1803 with the p-side (e.g., second semiconductor layer 1810) of first wafer 1802 facing down (i.e., toward wafer 1803). After bonding, substrate 1804 may be removed from first wafer 1802, and first wafer 1802 may then be processed from the n-side. The processing may include, for example, the formation of certain mesa shapes for individual LEDs, as well as the formation of optical components corresponding to the individual LEDs.

FIGS. 19A-19D illustrate an example of a method of hybrid bonding for arrays of LEDs according to certain embodiments. The hybrid bonding may generally include wafer cleaning and activation, high-precision alignment of contacts of one wafer with contacts of another wafer, dielectric bonding of dielectric materials at the surfaces of the wafers at room temperature, and metal bonding of the contacts by annealing at elevated temperatures. FIG. 19A shows a substrate 1910 with passive or active circuits 1920 manufactured thereon. As described above with respect to FIGS. 18A-18B, substrate 1910 may include, for example, a silicon wafer. Circuits 1920 may include drive circuits for the arrays of LEDs. A bonding layer may include dielectric regions 1940 and contact pads 1930 connected to circuits 1920 through electrical interconnects 1922. Contact pads 1930 may include, for example, Cu, Ag, Au, Al, W, Mo, Ni, Ti, Pt, Pd, or the like. Dielectric materials in dielectric regions 1940 may include SiCN, $SiO_2$, SiN, $Al_2O_3$, $HfO_2$, $ZrO_2$, $Ta_2O_5$, or the like. The bonding layer may be planarized and polished using, for example, chemical mechanical polishing, where the planarization or polishing may cause dishing (a bowl like profile) in the contact pads. The surfaces of the bonding layers may be cleaned and activated by, for example, an ion (e.g., plasma) or fast atom (e.g., Ar) beam 1905. The activated surface may be atomically clean and may be reactive for formation of direct bonds between wafers when they are brought into contact, for example, at room temperature.

FIG. 19B illustrates a wafer 1950 including an array of micro-LEDs 1970 fabricated thereon as described above. Wafer 1950 may be a carrier wafer and may include, for example, GaAs, InP, GaN, AlN, sapphire, SiC, Si, or the like. Micro-LEDs 1970 may include an n-type layer, an active region, and a p-type layer epitaxially grown on wafer 1950. The epitaxial layers may include various III-V semiconductor materials described above, and may be processed from the p-type layer side to etch mesa structures in the epitaxial layers, such as substantially vertical structures, parabolic structures, conic structures, or the like. Passivation layers and/or reflection layers may be formed on the sidewalls of the mesa structures. P-contacts 1980 and n-contacts 1982 may be formed in a dielectric material layer 1960 deposited on the mesa structures and may make electrical contacts with the p-type layer and the n-type layers, respectively. Dielectric materials in dielectric material layer 1960 may include, for example, SiCN, $SiO_2$, SiN, $Al_2O_3$, $HfO_2$, $ZrO_2$, $Ta_2O_5$, or the like. P-contacts 1980 and n-contacts 1982 may include, for example, Cu, Ag, Au, Al, W, Mo, Ni, Ti, Pt, Pd, or the like. The top surfaces of p-contacts 1980, n-contacts 1982, and dielectric material layer 1960 may form a bonding layer. The bonding layer may be planarized and polished using, for example, chemical mechanical polishing, where the polishing may cause dishing in p-contacts 1980 and n-contacts 1982. The bonding layer may then be cleaned and activated by, for example, an ion (e.g., plasma) or fast atom (e.g., Ar) beam 1915. The activated surface may be atomically clean and reactive for formation of direct bonds between wafers when they are brought into contact, for example, at room temperature.

FIG. 19C illustrates a room temperature bonding process for bonding the dielectric materials in the bonding layers. For example, after the bonding layer that includes dielectric regions 1940 and contact pads 1930 and the bonding layer that includes p-contacts 1980, n-contacts 1982, and dielectric material layer 1960 are surface activated, wafer 1950 and micro-LEDs 1970 may be turned upside down and brought into contact with substrate 1910 and the circuits formed thereon. In some embodiments, compression pressure 1925 may be applied to substrate 1910 and wafer 1950 such that the bonding layers are pressed against each other. Due to the surface activation and the dishing in the contacts, dielectric regions 1940 and dielectric material layer 1960 may be in direct contact because of the surface attractive force, and may react and form chemical bonds between them because the surface atoms may have dangling bonds and may be in unstable energy states after the activation. Thus, the dielectric materials in dielectric regions 1940 and dielectric material layer 1960 may be bonded together with or without heat treatment or pressure.

FIG. 19D illustrates an annealing process for bonding the contacts in the bonding layers after bonding the dielectric materials in the bonding layers. For example, contact pads 1930 and p-contacts 1980 or n-contacts 1982 may be bonded together by annealing at, for example, about 190-400° C. or higher. During the annealing process, heat 1935 may cause the contacts to expand more than the dielectric materials (due to different coefficients of thermal expansion), and thus may close the dishing gaps between the contacts such that contact pads 1930 and p-contacts 1980 or n-contacts 1982 may be in contact and may form direct metallic bonds at the activated surfaces.

In some embodiments where the two bonded wafers include materials having different coefficients of thermal expansion (CTEs), the dielectric materials bonded at room temperature may help to reduce or prevent misalignment of the contact pads caused by the different thermal expansions. In some embodiments, to further reduce or avoid the misalignment of the contact pads at a high temperature during annealing, trenches may be formed between micro-LEDs, between groups of micro-LEDs, through part or all of the substrate, or the like, before bonding.

After the micro-LEDs are bonded to the drive circuits, the substrate on which the micro-LEDs are fabricated may be thinned or removed, and various secondary optical components may be fabricated on the light emitting surfaces of the micro-LEDs to, for example, extract, collimate, and redirect the light emitted from the active regions of the micro-LEDs. In one example, micro-lenses may be formed on the micro-LEDs, where each micro-lens may correspond to a respective micro-LED and may help to improve the light extraction efficiency and collimate the light emitted by the micro-LED. In some embodiments, the secondary optical components may be fabricated in the substrate or the n-type layer of the micro-LEDs. In some embodiments, the secondary optical components may be fabricated in a dielectric layer deposited on the n-type side of the micro-LEDs. Examples of the secondary optical components may include a lens, a grating, an antireflection (AR) coating, a prism, a photonic crystal, or the like.

Figure 20:
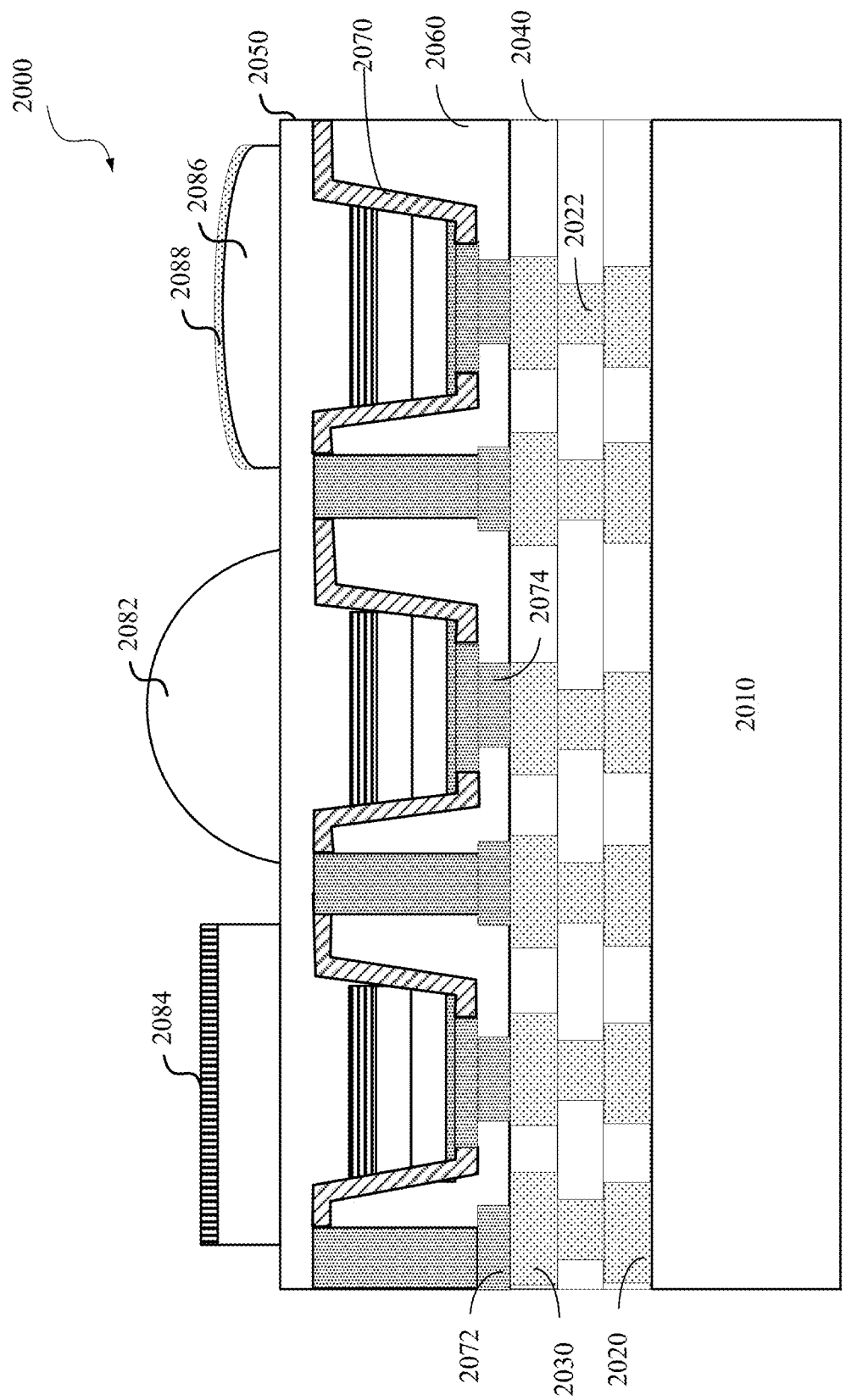
FIG. 20 illustrates an example of an LED array with secondary optical components fabricated thereon according to certain embodiments.

FIG. 20 illustrates an example of an LED array 2000 with secondary optical components fabricated thereon according to certain embodiments. LED array 2000 may be made by bonding an LED chip or wafer with a silicon wafer including electrical circuits fabricated thereon, using any suitable bonding techniques described above with respect to, for example, FIGS. 18A-19D. In the example shown in FIG. 20, LED array 2000 may be bonded using a wafer-to-wafer hybrid bonding technique as described above with respect to FIG. 19A-19D. LED array 2000 may include a substrate 2010, which may be, for example, a silicon wafer. Integrated circuits 2020, such as LED drive circuits, may be fabricated on substrate 2010. Integrated circuits 2020 may be connected to p-contacts 2074 and n-contacts 2072 of micro-LEDs 2070 through interconnects 2022 and contact pads 2030, where contact pads 2030 may form metallic bonds with p-contacts 2074 and n-contacts 2072. Dielectric layer 2040 on substrate 2010 may be bonded to dielectric layer 2060 through fusion bonding.

The substrate (not shown) of the LED chip or wafer may be thinned or may be removed to expose the n-type layer 2050 of micro-LEDs 2070. Various secondary optical components, such as a spherical micro-lens 2082, a grating 2084, a micro-lens 2086, an antireflection layer 2088, and the like, may be formed in or on top of n-type layer 2050. For example, spherical micro-lens arrays may be etched in the semiconductor materials of micro-LEDs 2070 using a gray-scale mask and a photoresist with a linear response to exposure light, or using an etch mask formed by thermal reflowing of a patterned photoresist layer. The secondary optical components may also be etched in a dielectric layer deposited on n-type layer 2050 using similar photolithographic techniques or other techniques. For example, micro-lens arrays may be formed in a polymer layer through thermal reflowing of the polymer layer that is patterned using a binary mask. The micro-lens arrays in the polymer layer may be used as the secondary optical components or may be used as the etch mask for transferring the profiles of the micro-lens arrays into a dielectric layer or a semiconductor layer. The dielectric layer may include, for example, SiCN, $SiO_2$, SiN, $Al_2O_3$, $HfO_2$, $ZrO_2$, $Ta_2O_5$, or the like. In some embodiments, a micro-LED 2070 may have multiple corresponding secondary optical components, such as a micro-lens and an anti-reflection coating, a micro-lens etched in the semiconductor material and a micro-lens etched in a dielectric material layer, a micro-lens and a grating, a spherical lens and an aspherical lens, and the like. Three different secondary optical components are illustrated in FIG. 20 to show some examples of secondary optical components that can be formed on micro-LEDs 2070, which does not necessary imply that different secondary optical components are used simultaneously for every LED array.

Embodiments disclosed herein may be used to implement components of an artificial reality system or may be implemented in conjunction with an artificial reality system. Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

Figure 21:
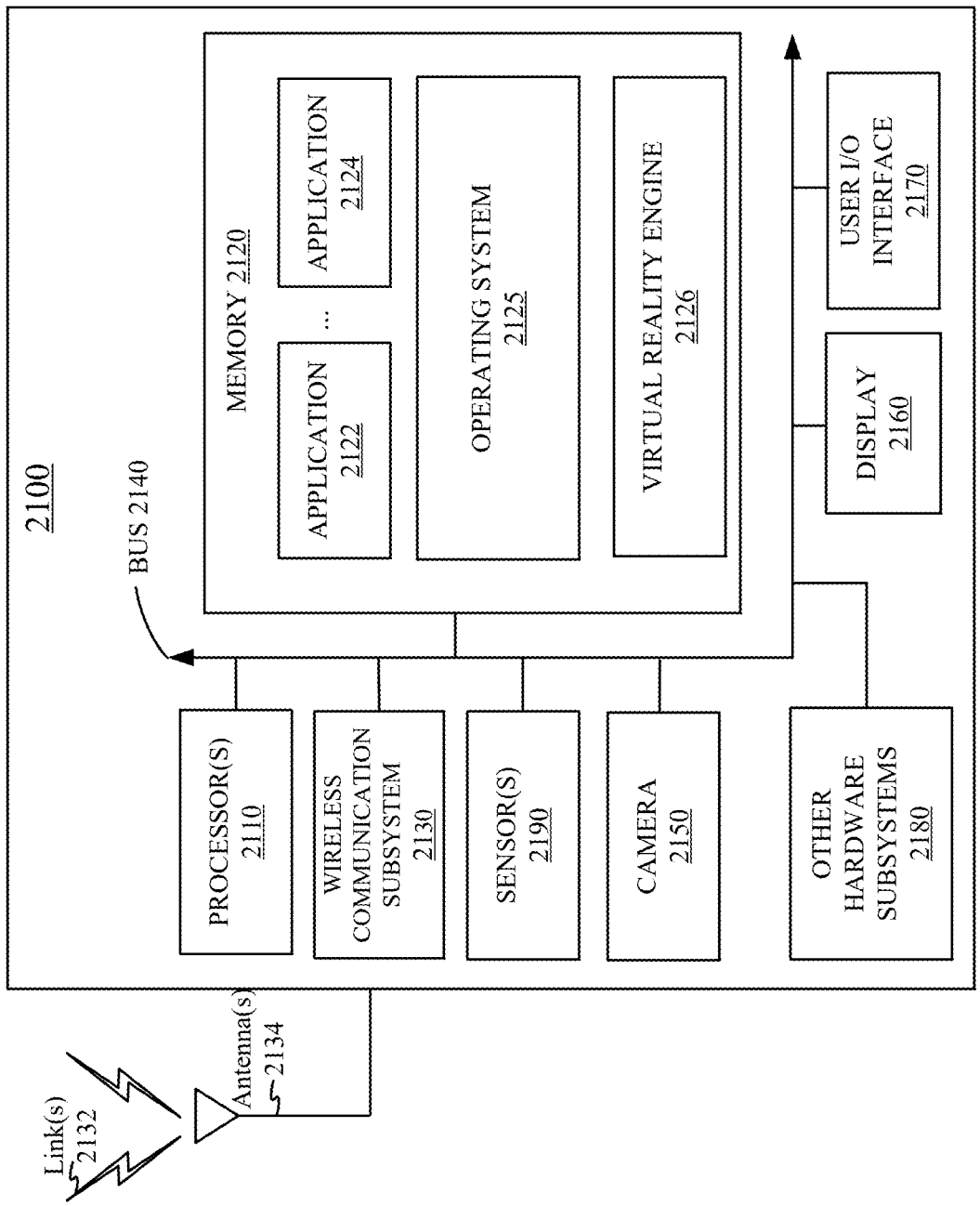
FIG. 21 is a simplified block diagram of an electronic system of an example of a near-eye display according to certain embodiments.

FIG. 21 is a simplified block diagram of an example electronic system 2100 of an example near-eye display (e.g., HMD device) for implementing some of the examples disclosed herein. Electronic system 2100 may be used as the electronic system of an HMD device or other near-eye displays described above. In this example, electronic system 2100 may include one or more processor(s) 2110 and a memory 2120. Processor(s) 2110 may be configured to execute instructions for performing operations at a number of components, and can be, for example, a general-purpose processor or microprocessor suitable for implementation within a portable electronic device. Processor(s) 2110 may be communicatively coupled with a plurality of components within electronic system 2100. To realize this communicative coupling, processor(s) 2110 may communicate with the other illustrated components across a bus 2140. Bus 2140 may be any subsystem adapted to transfer data within electronic system 2100. Bus 2140 may include a plurality of computer buses and additional circuitry to transfer data.

Memory 2120 may be coupled to processor(s) 2110. In some embodiments, memory 2120 may offer both short-term and long-term storage and may be divided into several units. Memory 2120 may be volatile, such as static random access memory (SRAM) and/or dynamic random access memory (DRAM) and/or non-volatile, such as read-only memory (ROM), flash memory, and the like. Furthermore, memory 2120 may include removable storage devices, such as secure digital (SD) cards. Memory 2120 may provide storage of computer-readable instructions, data structures, program code, and other data for electronic system 2100. In some embodiments, memory 2120 may be distributed into different hardware subsystems. A set of instructions and/or code might be stored on memory 2120. The instructions might take the form of executable code that may be executable by electronic system 2100, and/or might take the form of source and/or installable code, which, upon compilation and/or installation on electronic system 2100 (e.g., using any of a variety of generally available compilers, installation programs, compression/decompression utilities, etc.), may take the form of executable code.

In some embodiments, memory 2120 may store a plurality of applications 2122 through 2124, which may include any number of applications. Examples of applications may include gaming applications, conferencing applications, video playback applications, or other suitable applications. The applications may include a depth sensing function or eye tracking function. Applications 2122-2124 may include particular instructions to be executed by processor(s) 2110. In some embodiments, certain applications or parts of applications 2122-2124 may be executable by other hardware subsystems 2180. In certain embodiments, memory 2120 may additionally include secure memory, which may include additional security controls to prevent copying or other unauthorized access to secure information.

In some embodiments, memory 2120 may include an operating system 2125 loaded therein. Operating system 2125 may be operable to initiate the execution of the instructions provided by applications 2122-2124 and/or manage other hardware subsystems 2180 as well as interfaces with a wireless communication subsystem 2130 which may include one or more wireless transceivers. Operating system 2125 may be adapted to perform other operations across the components of electronic system 2100 including threading, resource management, data storage control and other similar functionality.

Wireless communication subsystem 2130 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 2100 may include one or more antennas 2134 for wireless communication as part of wireless communication subsystem 2130 or as a separate component coupled to any portion of the system. Depending on desired functionality, wireless communication subsystem 2130 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 2130 may permit data to be exchanged with a network, other computer systems, and/or any other devices described herein. Wireless communication subsystem 2130 may include a means for transmitting or receiving data, such as identifiers of HMD devices, position data, a geographic map, a heat map, photos, or videos, using antenna(s) 2134 and wireless link(s) 2132.

Embodiments of electronic system 2100 may also include one or more sensors 2190. Sensor(s) 2190 may include, for example, an image sensor, an accelerometer, a pressure sensor, a temperature sensor, a proximity sensor, a magnetometer, a gyroscope, an inertial sensor (e.g., a subsystem that combines an accelerometer and a gyroscope), an ambient light sensor, or any other similar devices or subsystems operable to provide sensory output and/or receive sensory input, such as a depth sensor or a position sensor. For example, in some implementations, sensor(s) 2190 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or some combination thereof. The position sensors may be located external to the IMU, internal to the IMU, or some combination thereof. At least some sensors may use a structured light pattern for sensing.

Electronic system 2100 may include a display 2160. Display 2160 may be a near-eye display, and may graphically present information, such as images, videos, and various instructions, from electronic system 2100 to a user. Such information may be derived from one or more applications 2122-2124, virtual reality engine 2126, one or more other hardware subsystems 2180, a combination thereof, or any other suitable means for resolving graphical content for the user (e.g., by operating system 2125). Display 2160 may use liquid crystal display (LCD) technology, light-emitting diode (LED) technology (including, for example, OLED, ILED, μLED, AMOLED, TOLED, etc.), light emitting polymer display (LPD) technology, or some other display technology.

Electronic system 2100 may include a user input/output interface 2170. User input/output interface 2170 may allow a user to send action requests to electronic system 2100. An action request may be a request to perform a particular action. For example, an action request may be to start or end an application or to perform a particular action within the application. User input/output interface 2170 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 2100. In some embodiments, user input/output interface 2170 may provide haptic feedback to the user in accordance with instructions received from electronic system 2100. For example, the haptic feedback may be provided when an action request is received or has been performed.

Electronic system 2100 may include a camera 2150 that may be used to take photos or videos of a user, for example, for tracking the user's eye position. Camera 2150 may also be used to take photos or videos of the environment, for example, for VR, AR, or MR applications. Camera 2150 may include, for example, a complementary metal-oxide-semiconductor (CMOS) image sensor with a few millions or tens of millions of pixels. In some implementations, camera 2150 may include two or more cameras that may be used to capture 3-D images.

In some embodiments, electronic system 2100 may include a plurality of other hardware subsystems 2180. Each of other hardware subsystems 2180 may be a physical subsystem within electronic system 2100. While each of other hardware subsystems 2180 may be permanently configured as a structure, some of other hardware subsystems 2180 may be temporarily configured to perform specific functions or temporarily activated. Examples of other hardware subsystems 2180 may include, for example, an audio output and/or input interface (e.g., a microphone or speaker), a near field communication (NFC) device, a rechargeable battery, a battery management system, a wired/wireless battery charging system, etc. In some embodiments, one or more functions of other hardware subsystems 2180 may be implemented in software.

In some embodiments, memory 2120 of electronic system 2100 may also store a virtual reality engine 2126. Virtual reality engine 2126 may execute applications within electronic system 2100 and receive position information, acceleration information, velocity information, predicted future positions, or some combination thereof of the HMD device from the various sensors. In some embodiments, the information received by virtual reality engine 2126 may be used for producing a signal (e.g., display instructions) to display 2160. For example, if the received information indicates that the user has looked to the left, virtual reality engine 2126 may generate content for the HMD device that mirrors the user's movement in a virtual environment. Additionally, virtual reality engine 2126 may perform an action within an application in response to an action request received from user input/output interface 2170 and provide feedback to the user. The provided feedback may be visual, audible, or haptic feedback. In some implementations, processor(s) 2110 may include one or more GPUs that may execute virtual reality engine 2126.

In various implementations, the above-described hardware and subsystems may be implemented on a single device or on multiple devices that can communicate with one another using wired or wireless connections. For example, in some implementations, some components or subsystems, such as GPUs, virtual reality engine 2126, and applications (e.g., tracking application), may be implemented on a console separate from the head-mounted display device. In some implementations, one console may be connected to or support more than one HMD.

In alternative configurations, different and/or additional components may be included in electronic system 2100. Similarly, functionality of one or more of the components can be distributed among the components in a manner different from the manner described above. For example, in some embodiments, electronic system 2100 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean A, B, C, or any combination of A, B, and/or C, such as AB, AC, BC, AA, ABC, AAB, AABBCCC, or the like.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A micro-light emitting diode (micro-LED) device comprising:
   a plurality of semiconductor epitaxial layers, the plurality of semiconductor epitaxial layers including a quantum well layer configured to emit light;
   an array of electrodes for an array of micro-LEDs, the array of electrodes coupled to the plurality of semiconductor epitaxial layers;
   an insulator grid coupled to the plurality of semiconductor epitaxial layers and positioned in regions between individual electrodes of the array of electrodes; and
   a gate grid coupled to the insulator grid and configured to apply an electric field through the insulator grid to the plurality of semiconductor epitaxial layers in the regions between the individual electrodes of the array of electrodes to electrically isolate the plurality of semiconductor epitaxial layers into individual micro-LEDs of the array of micro-LEDs,
   wherein the gate grid is configured to apply the electric field to accumulate electrons in regions of the quantum well layer that are aligned with the gate grid.

2. The micro-LED device of claim 1, wherein:
   the plurality of semiconductor epitaxial layers includes a cladding layer between the quantum well layer and the insulator grid and between the quantum well layer and the array of electrodes; and
   the gate grid is configured to apply the electric field to deplete holes in the cladding layer between the quantum well layer and the insulator grid.

3. The micro-LED device of claim 2, wherein the cladding layer is thinner in regions between the quantum well layer and the insulator grid than in regions between the quantum well layer and the array of electrodes.

4. The micro-LED device of claim 3, wherein the cladding layer between the quantum well layer and the array of electrodes includes an etch-stop layer embedded in the cladding layer.

5. The micro-LED device of claim 4, wherein the etch-stop layer includes AlAs.

6. The micro-LED device of claim 2, wherein:
   the plurality of semiconductor epitaxial layers includes at least two quantum barrier layers that sandwich the quantum well layer; and
   the cladding layer is characterized by an energy bandgap wider than energy bandgaps of the at least two quantum barrier layers.

7. The micro-LED device of claim 6, wherein the cladding layer includes AlGaInP.

8. The micro-LED device of claim 1, wherein the array of electrodes includes an array of anodes for the array of micro-LEDs.

9. The micro-LED device of claim 8, further comprising a common cathode for the array of micro-LEDs.

10. The micro-LED device of claim 1, wherein each electrode of the array of electrodes includes:
    a transparent conductive oxide layer coupled to the plurality of semiconductor epitaxial layers; and
    a metal layer coupled to the transparent conductive oxide layer.

11. The micro-LED device of claim 1, wherein the gate grid is electrically shorted to an electrode of the array of electrodes for a micro-LED of the array of micro-LEDs.

12. The micro-LED device of claim 1, further comprising a backplane bonded to the array of electrodes, the backplane including drive circuits for driving the array of micro-LEDs.

13. The micro-LED device of claim 1, further comprising an array of micro-lenses on a side of the plurality of semiconductor epitaxial layers opposing the array of electrodes.

14. The micro-LED device of claim 1, wherein each electrode of the array of electrodes includes:
    a transparent conductive oxide layer coupled to the plurality of semiconductor epitaxial layers;
    a first distributed Bragg reflector (DBR) structure coupled to the transparent conductive oxide layer;
    a metal layer coupled to the first DBR structure; and
    a through-via in the first DBR structure, the through-via electrically coupling the metal layer to the transparent conductive oxide layer.

15. The micro-LED device of claim 14, further comprising a second DBR structure, wherein the first DBR structure and the second DBR structure are on opposite sides of the plurality of semiconductor epitaxial layers to form a resonant cavity.

16. The micro-LED device of claim 1, wherein the gate grid includes a transparent conductive oxide layer coupled to the insulator grid.

17. The micro-LED device of claim 16, wherein the gate grid further includes a metal layer electrically coupled to the transparent conductive oxide layer.

18. The micro-LED device of claim 17, wherein the gate grid further includes:
    a DBR structure coupled to the transparent conductive oxide layer; and
    a through-via in the DBR structure, the through-via electrically coupling the metal layer to the transparent conductive oxide layer.

19. A micro-light emitting diode (micro-LED) device comprising:
    a plurality of semiconductor epitaxial layers, the plurality of semiconductor epitaxial layers including a quantum well layer configured to emit light;

an array of electrodes for an array of micro-LEDs, the array of electrodes coupled to the plurality of semiconductor epitaxial layers;

an insulator grid coupled to the plurality of semiconductor epitaxial layers and positioned in regions between individual electrodes of the array of electrodes; and a gate grid coupled to the insulator grid and configured to apply an electric field through the insulator grid to the plurality of semiconductor epitaxial layers in the regions between the individual electrodes of the array of electrodes to electrically isolate the plurality of semiconductor epitaxial layers into individual micro-LEDs of the array of micro-LEDs, wherein:
  the plurality of semiconductor epitaxial layers includes a cladding layer between the quantum well layer and the insulator grid and between the quantum well layer and the array of electrodes; and
  the gate grid is configured to apply the electric field to deplete holes in the cladding layer between the quantum well layer and the insulator grid.

20. A micro-light emitting diode (micro-LED) device comprising:

a plurality of semiconductor epitaxial layers, the plurality of semiconductor epitaxial layers including a quantum well layer configured to emit light;

an array of electrodes for an array of micro-LEDs, the array of electrodes coupled to the plurality of semiconductor epitaxial layers;

an insulator grid coupled to the plurality of semiconductor epitaxial layers and positioned in regions between individual electrodes of the array of electrodes; and a gate grid coupled to the insulator grid and configured to apply an electric field through the insulator grid to the plurality of semiconductor epitaxial layers in the regions between the individual electrodes of the array of electrodes to electrically isolate the plurality of semiconductor epitaxial layers into individual micro-LEDs of the array of micro-LEDs, wherein the plurality of semiconductor epitaxial layers includes a cladding layer between the quantum well layer and the array of electrodes but not between the quantum well layer and the insulator grid.

* * * * *